US010134776B2

United States Patent
Lee et al.

(10) Patent No.: US 10,134,776 B2
(45) Date of Patent: Nov. 20, 2018

(54) DISPLAY SUBSTRATE AND METHOD OF REPAIRING DEFECTS THEREOF

(71) Applicant: Samsung Display Co., LTD., Yongin-si, Gyeonggi-Do (KR)

(72) Inventors: Hong-Beom Lee, Hwaseong-si (KR); Ji-Hoon Shin, Asan-si (KR); Ho-Yong Shin, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/986,694

(22) Filed: Jan. 3, 2016

(65) Prior Publication Data

US 2016/0322397 A1 Nov. 3, 2016

(30) Foreign Application Priority Data

Apr. 28, 2015 (KR) .................. 10-2015-0059649

(51) Int. Cl.
*H01L 27/12* (2006.01)
*G02F 1/1362* (2006.01)

(52) U.S. Cl.
CPC .... *H01L 27/1244* (2013.01); *G02F 1/136213* (2013.01); *G02F 1/136259* (2013.01); *G02F 1/136286* (2013.01); *G02F 2001/136272* (2013.01)

(58) Field of Classification Search
CPC ... H01L 27/124; H01L 27/1288; H01L 27/12; H01L 27/1248; H01L 27/1255; H01L 29/4908; H01L 29/66757; H01L 29/78; H01L 29/41733; H01L 29/78696; H01L 2251/301; H01L 2251/5338; H01L 51/5209; H01L 51/5215; H01L 51/5228; H01L 51/5237; H01L 51/5284
USPC ............................ 257/401, 59, 223, 74, 204
See application file for complete search history.

(56) References Cited

U.S. PATENT DOCUMENTS

| | | | | |
|---|---|---|---|---|
| 2004/0266041 | A1* | 12/2004 | Kim | ............... G02F 1/13458 438/30 |
| 2006/0076562 | A1* | 4/2006 | Lee | ................... H01L 29/12 257/72 |
| 2008/0117344 | A1* | 5/2008 | Kim | ............ G02F 1/136259 349/39 |

FOREIGN PATENT DOCUMENTS

| | | | |
|---|---|---|---|
| KR | 1020010057022 A | 7/2001 | |
| KR | 1020030089926 A | 11/2003 | |
| KR | 1020040062139 A | 7/2004 | |
| KR | 1020090094534 A | 9/2009 | |

* cited by examiner

*Primary Examiner* — Chuong A Luu
(74) *Attorney, Agent, or Firm* — Cantor Colburn LLP

(57) ABSTRACT

A display substrate includes a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, a repair electrode extending in the second direction and overlapping the storage line, an organic layer disposed on the data metal pattern and a pixel electrode disposed on the organic layer and electrically connected to the drain electrode.

6 Claims, 32 Drawing Sheets

DISPLAY SUBSTRATE AND METHOD OF REPAIRING DEFECTS THEREOF

This application claims priority to Korean Patent Application No. 10-2015-0059649, filed on Apr. 28, 2015, and all the benefits accruing therefrom under 35 U.S.C. § 119, the content of which in its entirety is herein incorporated by reference.

BACKGROUND

1. Field

Exemplary embodiments of the invention relates to a display substrate and method of repairing defects of a display substrate. More particularly, the invention relates to a display substrate capable of repairing and method of repairing defects of the display substrate.

2. Description of the Related Art

Generally, a liquid crystal display ("LCD") panel includes a thin film transistor ("TFT") substrate, an opposing substrate and an LC layer. The TFT substrate includes a plurality of gate lines, a plurality of data lines crossing the gate lines, a plurality of TFTs connected to the gate lines and data lines, and a plurality of pixel electrodes connected to the TFTs. The TFT includes a gate electrode extended from the gate line, a source electrode extended to the data line, and a drain electrode spaced apart from the source electrode.

The signal line of the array substrate may have an electrical connection failure such as a short circuit, a shorting failure, etc. When the electrical connection failure is generated, a display quality of the LCD panel is deteriorated. Therefore, it is necessary to repair the signal line having the electrical connection failure.

SUMMARY

When defect of a pixel is occurred, a repairing process enforcedly offing a defective pixel is performed using a laser beam. In the repairing process, a storage line, a pixel electrode and a drain electrode are shorted, and thus a common voltage is applied to the pixel electrode. Therefore, repairing of a defective pixel is possible. However, repairing of a defective pixel having a defect which is caused by non-forming of a contact hole connecting the drain electrode and the pixel electrode may be difficult.

Exemplary embodiments of the invention provide a display substrate capable of selective repairing.

Exemplary embodiments of the invention further provide a method of repairing defects of the display substrate.

In an exemplary embodiment of a display substrate according to the invention, the display substrate includes a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, a repair electrode extending in the second direction and overlapping with the storage line, an organic layer disposed on the data metal pattern and a pixel electrode disposed on the organic layer and electrically connected to the drain electrode.

In an exemplary embodiment, the repair electrode may be disposed on the same layer as the data metal pattern and electrically connected to the drain electrode.

In an exemplary embodiment, the storage line may include a protrusion portion protruding along the second direction and overlapping with the repair electrode.

In an exemplary embodiment, the repair electrode may be disposed on the same layer as the pixel electrode and electrically connected to the pixel electrode.

In an exemplary embodiment, the storage line may include a protrusion portion protruding along the second direction and overlapping with the repair electrode.

In an exemplary embodiment, the storage line may be parallel with the gate line.

In an exemplary embodiment of method repairing a display substrate including a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, a repair electrode extending in the second direction and overlapping with the storage line, an organic layer disposed on the data metal pattern and a pixel electrode disposed on the organic layer and electrically connected to the drain electrode, when a defect of the display substrate is a defect which needs darkening of a defective pixel, the method includes enforcedly shorting the storage line and the repair electrode.

In an exemplary embodiment, the enforcedly shorting the storage line and the repair electrode may be performed using a laser beam.

In an exemplary embodiment, the repair electrode may be disposed on the same layer as the data metal pattern and electrically connected to the drain electrode.

In an exemplary embodiment, the storage line may include a protrusion portion protruding along the second direction and overlapping with the repair electrode.

In an exemplary embodiment, the repair electrode may be disposed on the same layer as the pixel electrode and electrically connected to the pixel electrode.

In an exemplary embodiment, the storage line may include a protrusion portion protruding along the second direction and overlapping with the repair electrode.

In an exemplary embodiment, the storage line may be parallel with the gate line.

In an exemplary embodiment of method repairing a display substrate including a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, a repair electrode extending in the second direction and overlapping with the storage line, an organic layer disposed on the data metal pattern and a pixel electrode disposed on the organic layer and electrically connected to the drain electrode, when a defect of the display substrate is a defect which is caused by non-forming of a contact hole connecting the drain electrode and the pixel electrode, the method includes enforcedly shorting the drain electrode and the pixel electrode.

In an exemplary embodiment, the enforcedly shorting the storage line and the repair electrode may be performed using a laser beam.

In an exemplary embodiment, the repair electrode may be disposed on the same layer as the data metal pattern and electrically connected to the drain electrode.

In an exemplary embodiment, the storage line may include a protrusion portion protruding along the second direction and overlapping with the repair electrode.

In an exemplary embodiment, the repair electrode may be disposed on the same layer as the pixel electrode and electrically connected to the pixel electrode.

In an exemplary embodiment, the storage line may include a protrusion portion protruding along the second direction and overlapping with the repair electrode In an exemplary embodiment, the storage line may be parallel with the gate line.

According to the exemplary embodiment, when a defect of the display substrate is a defect which needs darkening of a defective pixel, the repair electrode and the first storage line are enforcedly shorted for repairing the defective pixel. In addition, when a defect of the display substrate is a defect which is caused by non-forming of a contact hole connecting the drain electrode and the pixel electrode, the drain electrode and the pixel electrode are enforcedly shorted for repairing the defect. That is, a selective repairing a display substrate according to a defect of the display substrate may be performed.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Hereinafter, the invention will be explained in detail with reference to the accompanying drawings.

Figure 1:
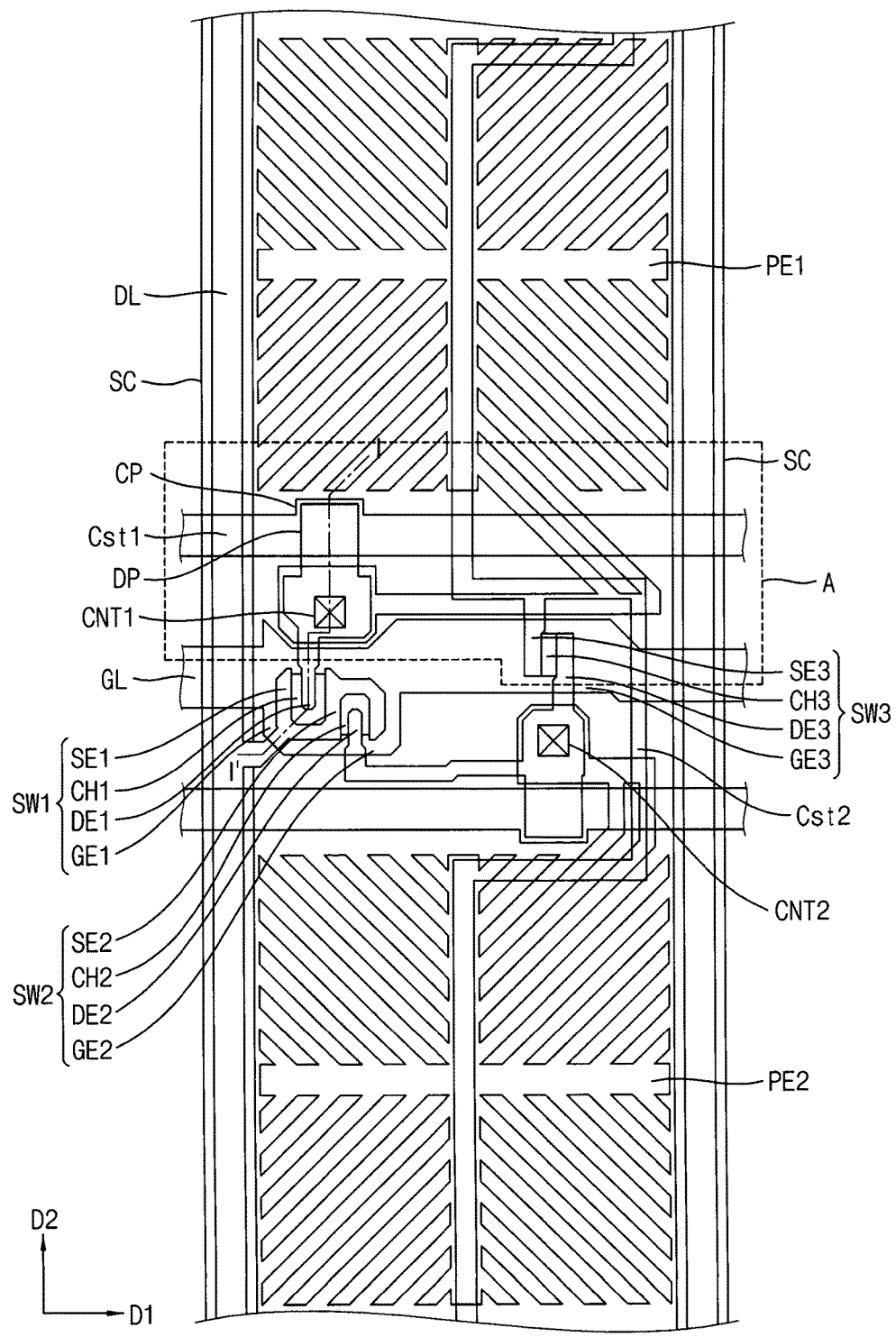
FIG. 1 is a plan view illustrating an exemplary embodiment of a display substrate according to the invention.
Figure 2:
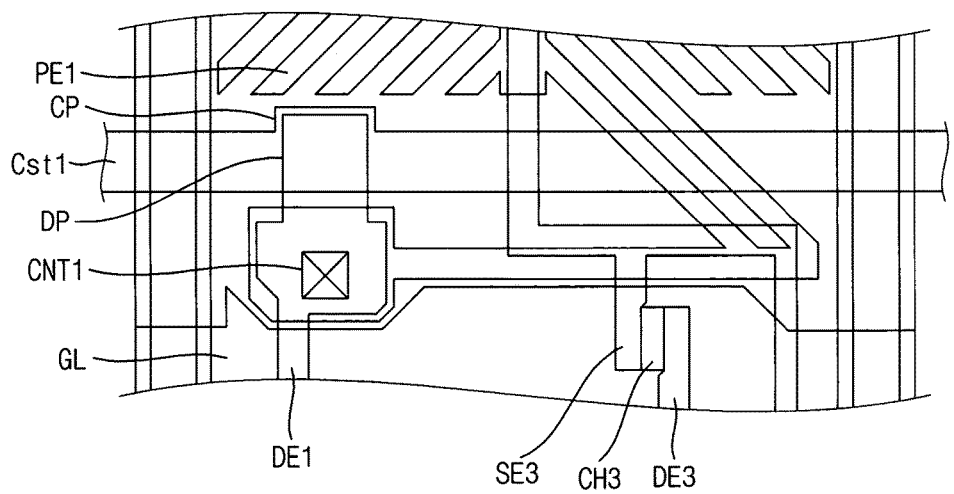
FIG. 2 is a plan view magnifying 'A' portion of FIG. 1.
Figure 3:
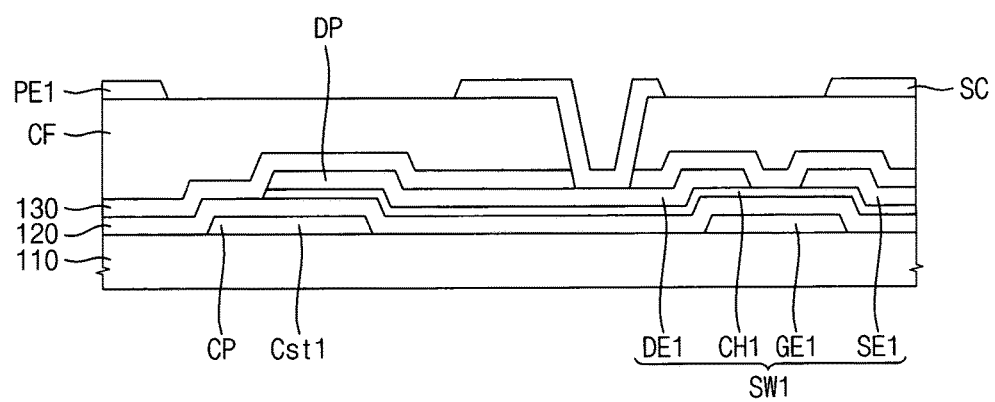
FIG. 3 is a cross-sectional view taken along line I-I' of FIG. 1.

FIG. 1 is a plan view illustrating a display substrate according to an exemplary embodiment of the invention. FIG. 2 is a plan view magnifying 'A' portion of FIG. 1. FIG. 3 is a cross-sectional view taken along line I-I' of FIG. 1.

Referring to FIGS. 1 to 3, a display substrate includes a gate line GL, a data line DL, a first storage line Cst1, a second storage line Cst2, a shielding electrode SC, a repair electrode DP, a first switching element SW1, a second switching element SW2, a third switching element SW3, a high-pixel electrode PE1 and a low-pixel electrode PE2.

The gate line GL extends in a first direction D1. In an exemplary embodiment, the gate line GL may have a single layer structure including copper (Cu), silver (Ag), chrome (Cr), molybdenum (Mo), aluminum (Al), titanium (Ti), manganese (Mn) and a combination thereof, for example. In an exemplary embodiment, the gate line GL may have a multi layer structure having a plurality of layers including materials different each other. In an exemplary embodiment, the gate line GL may include a copper layer and a titanium layer disposed on and/or under the copper layer, for example. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is provided from the same layer as the gate line GL. Thus, the first storage line Cst1 may be disposed on the same layer as the gate line GL. In an exemplary embodiment, the first storage line Cst1 may have a single layer structure including copper (Cu), silver (Ag), chrome (Cr), molybdenum (Mo), aluminum (Al), titanium (Ti), manganese (Mn) and a combination thereof, for example. In an exemplary embodiment, the first storage line Cst1 may have a multi layer structure having a plurality of layers including materials different each other. In an exemplary embodiment, the first storage line Cst1 may include a copper layer and a titanium layer disposed on and/or under the copper layer, for example.

A first insulation layer 120 is disposed on the gate line GL and the first storage line Cst1. The first insulation layer 120 may include an inorganic material such as silicon oxide (SiOx) and/or silicon nitride (SiNx). In an exemplary embodiment, the first insulation layer 120 includes silicon oxide (SiOx), and may have a thickness of about 500 angstroms (Å), for example. In an exemplary embodiment, the first insulation layer 120 may include a plurality of layers including different materials from each other.

The data line DL is disposed on first insulation layer 120. The data line DL extends in a second direction D2 crossing the first direction D1. The data line DL crosses the gate line GL. In an exemplary embodiment, the data line DL may have a single layer structure including copper (Cu), silver (Ag), chrome (Cr), molybdenum (Mo), aluminum (Al), titanium (Ti), manganese (Mn) and a combination thereof, for example. In an exemplary embodiment, the data line DL may have a multi layer structure having a plurality of layers including materials different each other. In an exemplary embodiment, the data line DL may include a copper layer and a titanium layer disposed on and/or under the copper layer, for example. The data line DL may be electrically connected to a first source electrode SE1 of the first switching element SW1, and a second source electrode SE2 of the second switching element SW2.

The second storage line Cst2 is provided from the same layer as the data line DL. Thus, the second storage line Cst2 may be disposed on the same layer as the data line DL. In an exemplary embodiment, the second storage line Cst2 may have a single layer structure including copper (Cu), silver (Ag), chrome (Cr), molybdenum (Mo), aluminum (Al), titanium (Ti), manganese (Mn) and a combination thereof. In an exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 may be electrically connected to a third source electrode SE3 of the third switching element SW3.

A second insulation layer 130 is disposed on the data line DL and the second storage line Cst2. In an exemplary embodiment, the second insulation layer 130 may include an inorganic material such as silicon oxide (SiOx) and/or silicon nitride (SiNx). In an exemplary embodiment, the second insulation layer 130 includes silicon oxide (SiOx), and may have a thickness of about 500 Å, for example. In an exemplary embodiment, the second insulation layer 130 may include a plurality of layers including different materials from each other.

An organic layer CF is disposed on the second insulation layer 130. The organic layer CF planarizes an upper surface of the substrate so that problems due to the step such as disconnection of a signal line may be prevented. The organic layer CF may be an insulation layer including an organic material. In an exemplary embodiment, the organic layer CF may a color filter layer, for example.

A shielding electrode SC is disposed on the organic layer CF. In an exemplary embodiment, the shielding electrode SC may include a transparent conductive material, such as indium tin oxide ("ITO") and indium zinc oxide ("IZO"). In an exemplary embodiment, the shielding electrode SC may include titanium (Ti) and/or molybdenum titanium (MoTi), for example.

A display panel according to another exemplary embodiment may include a display substrate, a facing substrate facing the display substrate and liquid crystal layer interposed between the display substrate and the facing substrate. The facing substrate may include a common electrode. The common electrode is disposed on an entirely region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. Thus, a direction of the molecules of the liquid crystal may be equal to a direction of a polarizer, so that a region on the shielding electrode SC may be black. Therefore, a light may be blocked without a black matrix.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The high-pixel electrode PE1 is disposed adjacent to the gate line GL in the second direction D2, and between the data lines DL in the first direction D1. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL in the first direction D1. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. In an exemplary embodiment, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel, for example.

The first switching element SW1 includes the first gate electrode GE1, the first source electrode SE1, the first drain electrode DE1 and a first channel portion CH1 connecting the first source electrode SE1 to the first drain electrode DE1.

In an exemplary embodiment, the first channel portion CH1 may include a semiconductor layer including amorphous silicon (a-Si:H) and an ohmic contact layer including n+ amorphous silicon (n+ a-Si:H), for example. In an exemplary embodiment, the first channel portion CH1 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The second switching element SW2 includes the second gate electrode GE2, the second source electrode SE2, the second drain electrode DE2 and a second channel portion CH2 connecting the second source electrode SE2 to the second drain electrode DE2.

In an exemplary embodiment, the second channel portion CH2 may include a semiconductor layer including amorphous silicon (a-Si:H) and an ohmic contact layer including n+ amorphous silicon (n+ a-Si:H), for example. In an exemplary embodiment, the second channel portion CH2 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The third switching element SW3 includes the third gate electrode GE3, the third source electrode SE3, the third drain electrode DE3 and a third channel portion CH3 connecting the third source electrode SE3 to the third drain electrode DE3.

In an exemplary embodiment, the third channel portion CH3 may include a semiconductor layer including amorphous silicon (a-Si:H) and an ohmic contact layer including n+ amorphous silicon (n+ a-Si:H), for example. In an exemplary embodiment, the third channel portion CH3 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

A display substrate according to an exemplary embodiment of the invention includes a repair electrode DP. The repair electrode DP is disposed on the same layer as the first drain electrode DE1. The repair electrode DP is electrically connected to the first drain electrode DE1. The repair electrode DP extends in the second direction D2. The repair electrode DP overlaps the first storage line Cst1. When a defect of the display substrate is a defect which needs darkening of a defective pixel to repair the defect, the repair electrode DP and the first storage line Cst1 are enforcedly shorted for repairing the defective pixel. In an exemplary embodiment, the process of enforcedly shorting the repair electrode DP and the first storage line Cst1 may be performed using a laser beam, for example.

The first storage line Cst1 includes a protrusion portion CP protruding along the second direction D2 and overlapping with the repair electrode DP. The repair electrode DP is disposed in the protrusion portion CP in a plan view.

When a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

According to the exemplary embodiment, when a defect of the display substrate is a defect which needs darkening of a defective pixel to repair the defect, the repair electrode DP and the first storage line Cst1 are enforcedly shorted for repairing the defective pixel. In addition, when a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. That is, a selective repairing a display substrate according to a defect of the display substrate may be performed.

FIGS. 4 to 7 are cross-sectional views illustrating a method of manufacturing the display substrate of FIG. 3.

Figure 4:
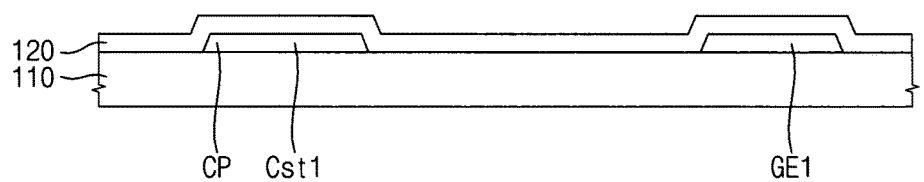
FIGS. 4 to 7 are cross-sectional views illustrating a method of manufacturing the display substrate of FIG. 3.

Referring to FIG. 4, a gate metal layer is disposed on a base substrate 110, and then the gate metal layer may be partially etched by a photolithography process or an etching process using an additional etching mask, for example. Hence, the gate pattern is provided. The gate pattern includes a first storage line Cst1, a gate line GL, a first gate electrode GE1, a second gate electrode GE2 and a third gate electrode GE3.

The base substrate 110 may include a material which has relatively high transmittance, thermal resistance, and chemical resistance. In an exemplary embodiment, the base substrate 110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first storage line Cst1 includes a protrusion portion CP protruding along the second direction D2 and overlapping with the repair electrode DP.

The first insulation layer 120 is disposed on the base substrate 110 on which gate pattern is provided. The first insulation layer 120 is disposed on the gate pattern. The first insulation layer 120 covers and insulates the first storage line Cst1, the gate line GL, the first gate electrode GE1, the second gate electrode GE2 and the third gate electrode GE3.

Figure 5:
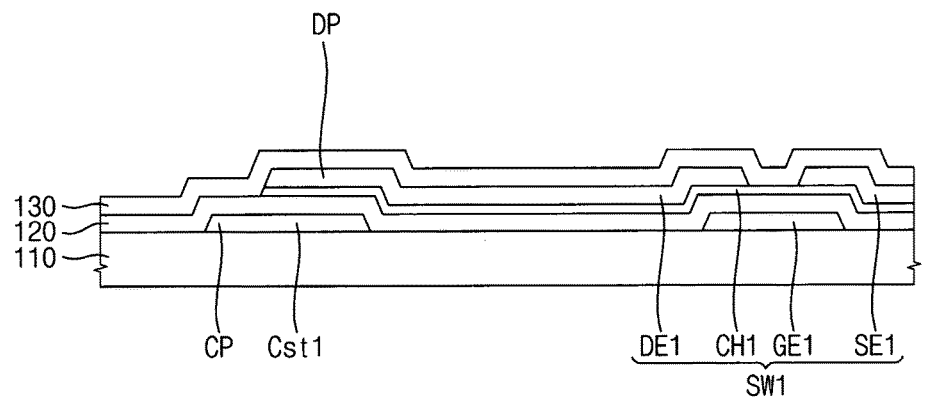

Referring to FIG. 5, a semiconductor layer and a data metal layer are disposed on the base substrate 110 on which the first insulation layer 120 is provided. Thereafter, the semiconductor layer and the data metal layer may be partially etched by a photolithography process or an etching process using an additional etching mask. Hence, a channel layer including a first channel portion CH1, a data metal pattern and a repair electrode DP are provided.

In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal pattern have a single layer structure including copper (Cu), silver (Ag), chrome (Cr), molybdenum (Mo), aluminum (Al), titanium (Ti), manganese (Mn) and a combination thereof. In another exemplary embodiment, the data metal pattern may have a multi layer structure having a plurality of layers including materials different each other.

The repair electrode DP is disposed on the same layer as the first drain electrode DE1. The repair electrode DP is electrically connected to the first drain electrode DE1. The repair electrode DP extends in the second direction D2. The repair electrode DP overlaps the first storage line Cst1.

A second insulation layer 130 is disposed on the base substrate 110 on which the data pattern and the channel layer are provided.

In an exemplary embodiment, the second insulation layer 130 may be provided by a spin coating process, a printing process, a sputtering process, a chemical vapor deposition ("CVD") process, an atomic layer deposition ("ALD") process, a plasma-enhanced chemical vapor deposition ("PECVD") process, an high density plasma chemical vapor deposition ("HDP-CVD") process or a vacuum evaporation process in accordance with ingredients included in the second insulation layer 130, for example. The second insulation layer 130 is disposed on the data pattern. The second insulation layer 130 covers and insulates the first drain electrode DE1, the first source electrode SE1, the second source electrode SE2, the second drain electrode DE2, the third source electrode SE3, the third drain electrode DE3 and the data line DL.

Figure 6:
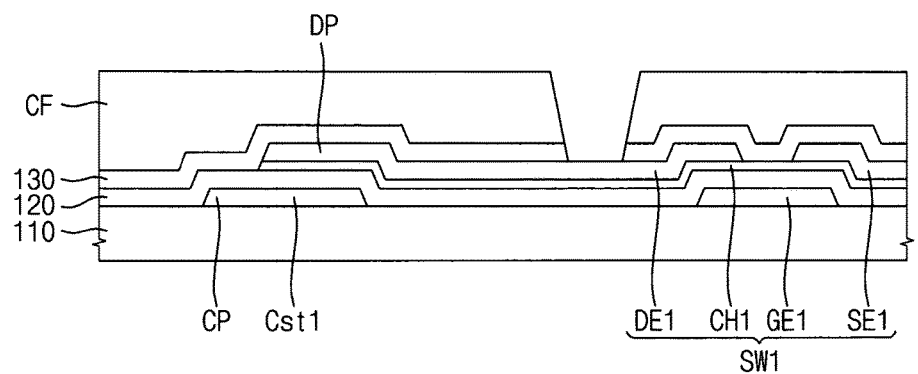

Referring to FIG. 6, an organic layer CF is disposed on the base substrate 110 on which the second insulation layer 130 is provided. In an exemplary embodiment, the organic layer CF may be a color filter layer, for example. A photoresist is disposed on the second insulation layer 130, and then the photoresist is exposed using a mask, and then the photoresist is developed using a developing solution. Hence, the organic layer CF may be provided. Thereafter, the organic layer CF is patterned to define a first contact hole CNT1.

The organic layer CF is disposed on the second insulation layer 130. When the organic layer CF is color filter layer, the color filter layer supplies colors to the light passing through the liquid crystal layer. In an exemplary embodiment, the color filter layer may include a red color filter layer, a green color filter layer and blue color filter layer. The color filter layer corresponds to a unit pixel. In an exemplary embodiment, the color filter layers adjacent to each other may have different colors. In an exemplary embodiment, the color filter layer may be overlapped with adjacent color filter layer in a boundary of the adjacent unit pixels. In another exemplary embodiment, the color filter layer may be spaced apart from adjacent color filter layer in the boundary of the adjacent unit pixels.

Figure 7:
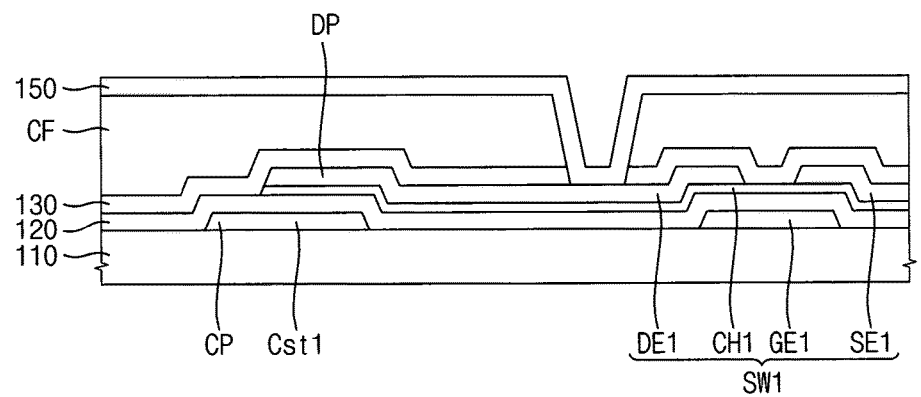

Referring to FIG. 7, a transparent conductive layer 150 is disposed on the base substrate 110 on which the organic layer CF is provided.

In an exemplary embodiment, the transparent conductive layer 150 may include a transparent conductive material, such as ITO and IZO. In an exemplary embodiment, the transparent conductive layer 150 may include titanium (Ti) and/or molybdenum titanium (MoTi), for example.

Referring back to FIG. 3, the transparent conductive layer 150 is patterned to form the shielding electrode SC and the pixel electrode. The pixel electrode may include the high-pixel electrode PE1 and the low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

Figure 8:
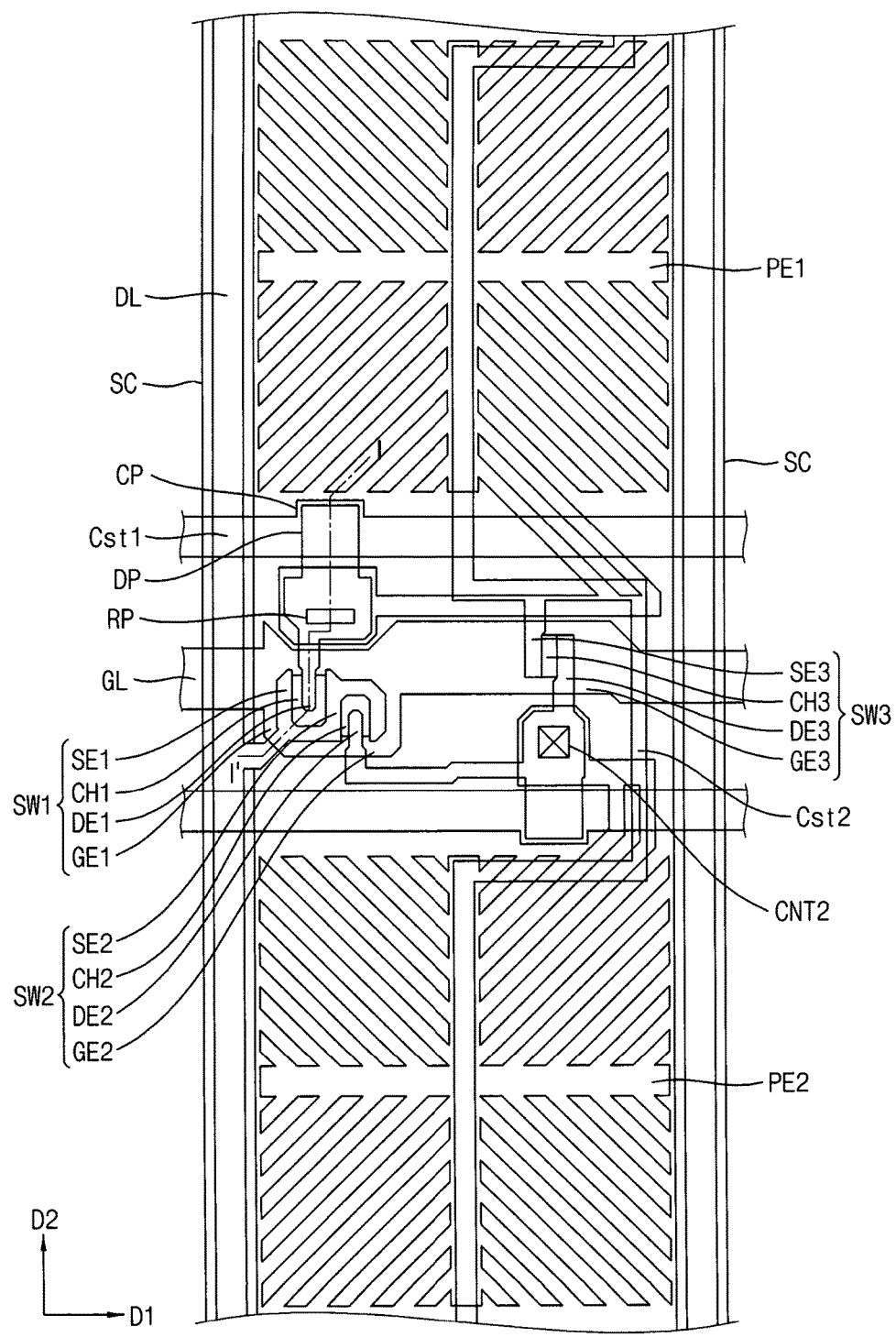
FIG. 8 is a plan view illustrating an exemplary embodiment of a display substrate repaired by a method of repairing a display substrate according to the invention.
Figure 9:
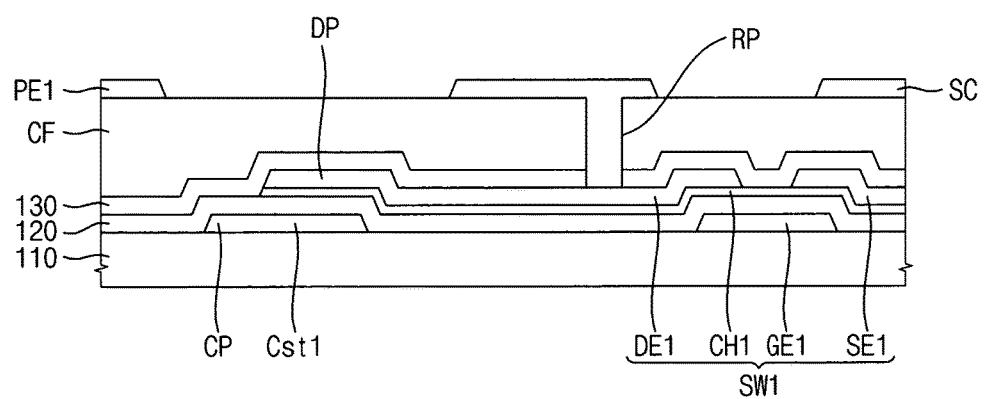
FIG. 9 is a cross-sectional view taken along line I-I' of FIG. 8.

FIG. 8 is a plan view illustrating a display substrate repaired by a method of repairing a display substrate according to an exemplary embodiment of the invention. FIG. 9 is a cross-sectional view taken along line I-I' of FIG. 8.

Referring to FIGS. 8 and 9, when a defect of the display substrate is a defect which is caused by non-forming of a contact hole connecting the first drain electrode DE1 and the high pixel electrode PE1, a display substrate repaired by a method of repairing a display substrate according to an exemplary embodiment of the invention is illustrated.

When a defect of the display substrate is a defect which is caused by non-forming of a contact hole connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

A laser beam is irradiated to an overlapping region of the first drain electrode DE1 and the high pixel electrode PE1, and thus a repair point RP is provided. The first drain electrode DE1 is electrically connected to the high pixel electrode PE1 by the repair point RP. Therefore, a display substrate having a defect which is caused by non-forming of a contact hole connecting the first drain electrode DE1 and the high pixel electrode PE1 may be repaired.

Figure 10:
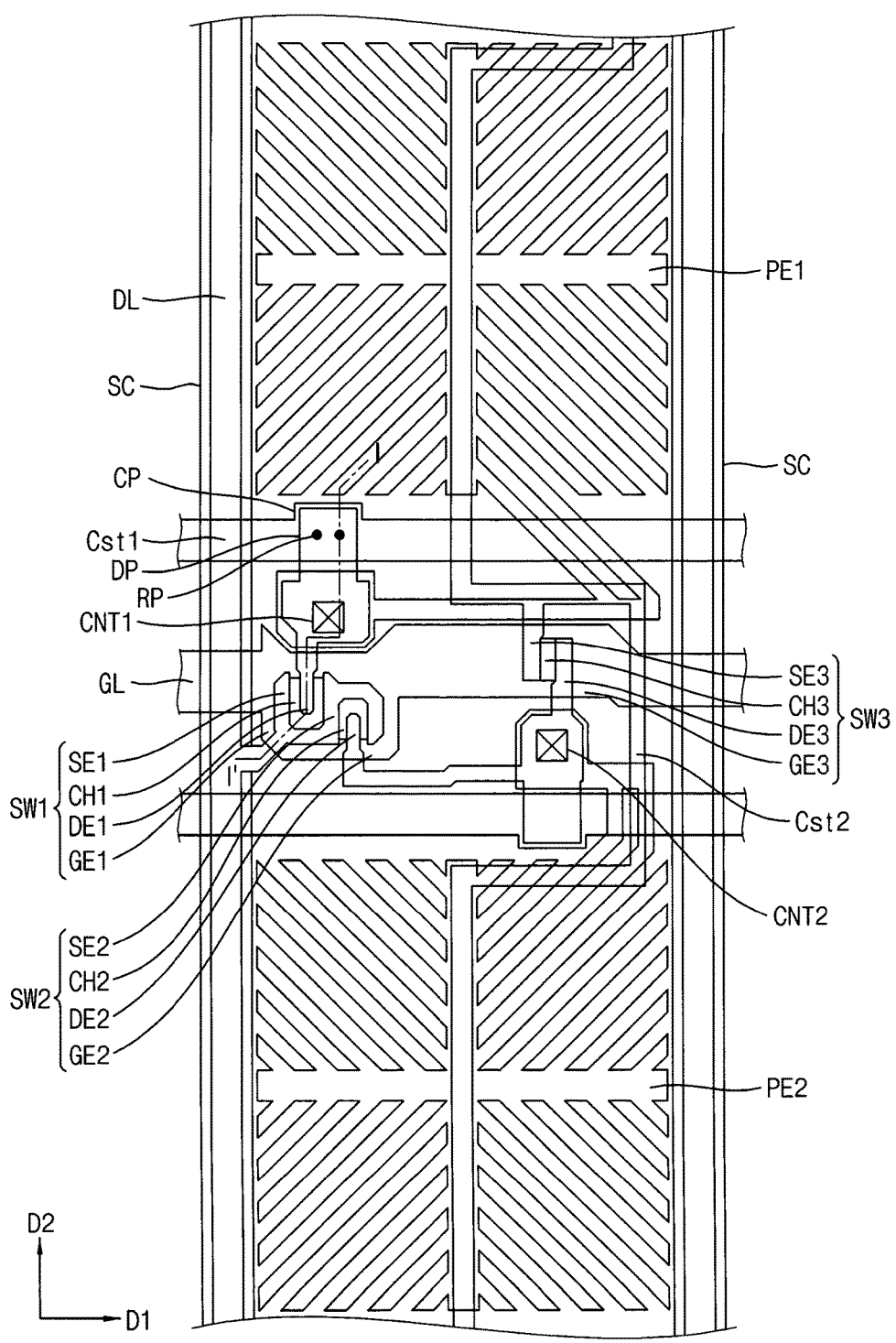
FIG. 10 is a plan view illustrating an exemplary embodiment of a display substrate repaired by a method of repairing a display substrate according to the invention.
Figure 11:
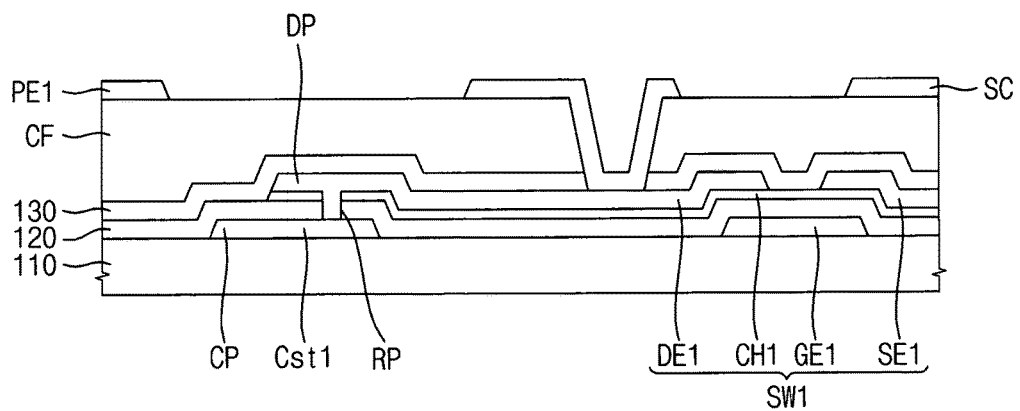
FIG. 11 is a cross-sectional view taken along line I-I' of FIG. 10.

FIG. 10 is a plan view illustrating a display substrate repaired by a method of repairing a display substrate according to an exemplary embodiment of the invention. FIG. 11 is a cross-sectional view taken along line I-I' of FIG. 10.

Referring to FIGS. 10 and 11, when a defect of the display substrate is a defect which needs darkening of a defective pixel to repair the defect, a display substrate repaired by a method of repairing a display substrate according to an exemplary embodiment of the invention is illustrated.

When a defect of the display substrate is a defect which needs darkening of a defective pixel to repair the defect, the repair electrode DP and the first storage line Cst1 are enforcedly shorted for repairing the defective pixel. In an exemplary embodiment, the process of enforcedly shorting the repair electrode DP and the first storage line Cst1 may be performed using a laser beam, for example.

A laser beam is irradiated to an overlapping region of the repair electrode DP and the first storage line Cst1, and thus a repair point RP is provided. The repair electrode DP is electrically connected to the first storage line Cst1 by the repair point RP. In addition, the first drain electrode DE1 is electrically connected to the repair electrode DP. Therefore, the first drain electrode DE1 and the first storage line Cst1 are shorted, and thus the high pixel electrode PE1 may be darkened.

Figure 12:
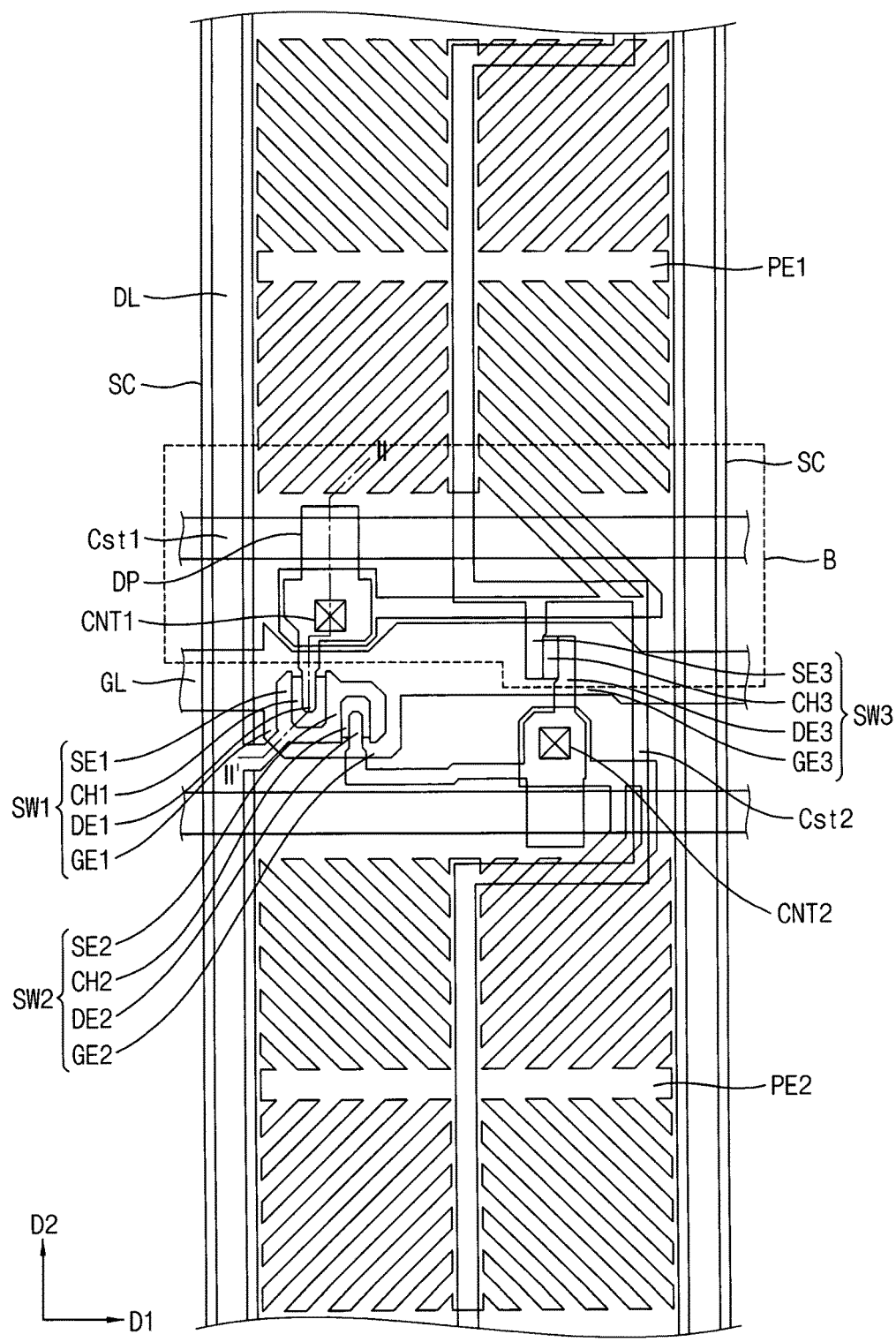
FIG. 12 is a plan view illustrating an exemplary embodiment of a display substrate according to the invention.
Figure 13:
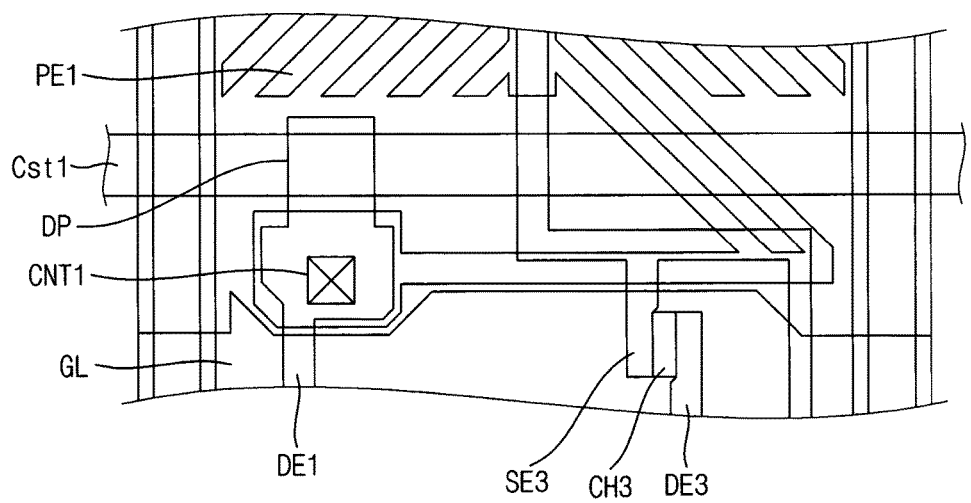
FIG. 13 is a plan view magnifying 13' portion of FIG. 12.
Figure 14:
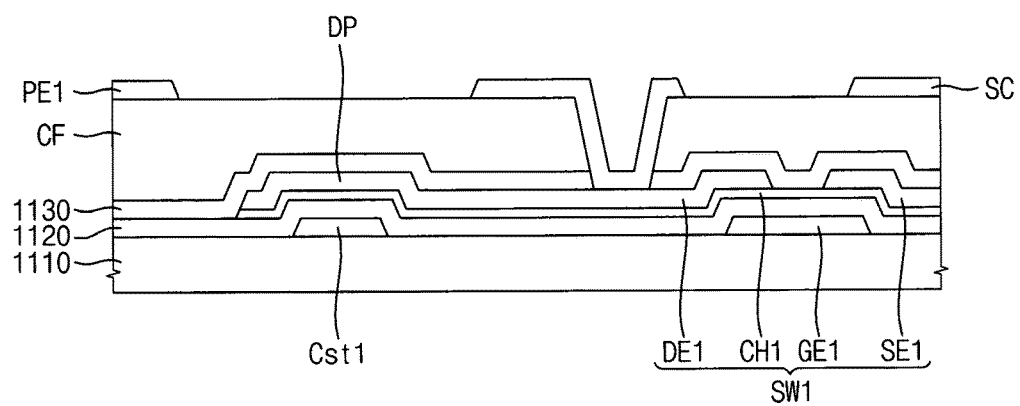
FIG. 14 is a cross-sectional view taken along line II-IF of FIG. 12.

FIG. 12 is a plan view illustrating a display substrate according to an exemplary embodiment of the invention. FIG. 13 is a plan view magnifying 13' portion of FIG. 12. FIG. 14 is a cross-sectional view taken along line II-IF of FIG. 12.

Referring to FIGS. 12 to 14, a display substrate includes a gate line GL, a data line DL, a first storage line Cst1, a second storage line Cst2, a shielding electrode SC, a repair electrode DP, a first switching element SW1, a second switching element SW2, a third switching element SW3, a high-pixel electrode PE1 and a low-pixel electrode PE2.

The gate line GL extends in a first direction D1. In an exemplary embodiment, the gate line GL may have a single layer structure including copper (Cu), silver (Ag), chrome (Cr), molybdenum (Mo), aluminum (Al), titanium (Ti), manganese (Mn) and a combination thereof, for example. In an exemplary embodiment, the gate line GL may have a multi layer structure having a plurality of layers including materials different each other. In an exemplary embodiment, the gate line GL may include a copper layer and a titanium layer disposed on and/or under the copper layer, for example. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is provided from the same layer as the gate line GL. Thus, the first storage line Cst1 may be disposed on the same layer as the gate line GL. In an exemplary embodiment, the first storage line Cst1 may have a single layer structure including copper (Cu), silver (Ag), chrome (Cr), molybdenum (Mo), aluminum (Al), titanium (Ti), manganese (Mn) and a combination thereof, for example. In an exemplary embodiment, the first storage line Cst1 may have a multi layer structure having a plurality of layers including materials different each other. In an exemplary embodiment, the first storage line Cst1 may include a copper layer and a titanium layer disposed on and/or under the copper layer, for example.

A first insulation layer 1120 is disposed on the gate line GL and the first storage line Cst1. In an exemplary embodiment, the first insulation layer 1120 may include an inorganic material such as silicon oxide (SiOx) and/or silicon nitride (SiNx), for example. In an exemplary embodiment, the first insulation layer 1120 includes silicon oxide (SiOx), and may have a thickness of about 500 Å, for example. In an exemplary embodiment, the first insulation layer 1120 may include a plurality of layers including different materials from each other.

The data line DL is disposed on first insulation layer 1120. The data line DL extends in a second direction D2 crossing the first direction D1. The data line DL crosses the gate line GL. In an exemplary embodiment, the data line DL may have a single layer structure including copper (Cu), silver (Ag), chrome (Cr), molybdenum (Mo), aluminum (Al), titanium (Ti), manganese (Mn) and a combination thereof. In an exemplary embodiment, the data line DL may have a multi layer structure having a plurality of layers including materials different each other. In an exemplary embodiment, the data line DL may include a copper layer and a titanium layer disposed on and/or under the copper layer, for example. The data line DL may be electrically connected to a first source electrode SE1 of the first switching element SW1, and a second source electrode SE2 of the second switching element SW2.

The second storage line Cst2 is provided from the same layer as the data line DL. Thus, the second storage line Cst2 may be disposed on the same layer as the data line DL. In an exemplary embodiment, the second storage line Cst2 may have a single layer structure including copper (Cu), silver (Ag), chrome (Cr), molybdenum (Mo), aluminum (Al), titanium (Ti), manganese (Mn) and a combination thereof, for example. In an exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 may be electrically connected to a third source electrode SE3 of the third switching element SW3.

A second insulation layer 1130 is disposed on the data line DL and the second storage line Cst2. The second insulation layer 1130 may include an inorganic material such as silicon oxide (SiOx) and/or silicon nitride (SiNx). In an exemplary embodiment, the second insulation layer 1130 includes silicon oxide (SiOx), and may have a thickness of about 500 Å, for example. In an exemplary embodiment, the second insulation layer 1130 may include a plurality of layers including different materials from each other.

An organic layer CF is disposed on the second insulation layer 1130. The organic layer CF planarizes an upper surface of the substrate so that problems due to the step such as disconnection of a signal line may be prevented. The organic layer CF may be an insulation layer including an organic material. In an exemplary embodiment, the organic layer CF may a color filter layer, for example.

A shielding electrode SC is disposed on the organic layer CF. In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

A display panel according to another exemplary embodiment may include a display substrate, a facing substrate facing the display substrate and liquid crystal layer interposed between the display substrate and the facing substrate. The facing substrate may include a common electrode. The common electrode is disposed on an entirely region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. Thus, a direction of the molecules of the liquid crystal may be equal to a direction of a polarizer, so that a region on the shielding electrode SC may be black. Therefore, a light may be blocked without a black matrix.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The high-pixel electrode PE1 is disposed adjacent to the gate line GL in the second direction D2, and between the data lines DL in the first direction D1. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL in the first direction D1. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. In an exemplary embodiment, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel, for example.

The first switching element SW1 includes the first gate electrode GE1, the first source electrode SE1, the first drain electrode DE1 and a first channel portion CH1 connecting the first source electrode SE1 to the first drain electrode DE1.

In an exemplary embodiment, the first channel portion CH1 may include a semiconductor layer including amorphous silicon (a-Si:H) and an ohmic contact layer including n+ amorphous silicon (n+ a-Si:H), for example. In an exemplary embodiment, the first channel portion CH1 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The second switching element SW2 includes the second gate electrode GE2, the second source electrode SE2, the second drain electrode DE2 and a second channel portion CH2 connecting the second source electrode SE2 to the second drain electrode DE2.

In an exemplary embodiment, the second channel portion CH2 may include a semiconductor layer including amorphous silicon (a-Si:H) and an ohmic contact layer including n+ amorphous silicon (n+ a-Si:H), for example. In an exemplary embodiment, the second channel portion CH2 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The third switching element SW3 includes the third gate electrode GE3, the third source electrode SE3, the third drain electrode DE3 and a third channel portion CH3 connecting the third source electrode SE3 to the third drain electrode DE3.

In an exemplary embodiment, the third channel portion CH3 may include a semiconductor layer including amorphous silicon (a-Si:H) and an ohmic contact layer including n+ amorphous silicon (n+ a-Si:H), for example. In an exemplary embodiment, the third channel portion CH3 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

A display substrate according to an exemplary embodiment of the invention includes a repair electrode DP. The repair electrode DP is disposed on the same layer as the first drain electrode DE1. The repair electrode DP is electrically connected to the first drain electrode DE1. The repair electrode DP extends in the second direction D2. The repair electrode DP overlaps the first storage line Cst1. When a defect of the display substrate is a defect which needs darkening of a defective pixel to repair the defect, the repair electrode DP and the first storage line Cst1 are enforcedly shorted for repairing the defective pixel. In an exemplary embodiment, the process of enforcedly shorting the repair electrode DP and the first storage line Cst1 may be performed using a laser beam, for example.

When a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

According to the exemplary embodiment, when a defect of the display substrate is a defect which needs darkening of a defective pixel to repair the defect, the repair electrode DP and the first storage line Cst1 are enforcedly shorted for repairing the defective pixel. In addition, when a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. That is, a selective repairing a display substrate according to a defect of the display substrate may be performed.

FIGS. 15 to 18 are cross-sectional views illustrating a method of manufacturing the display substrate of FIG. 14.

Figure 15:
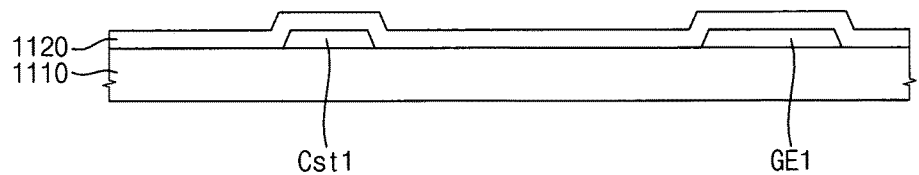
FIGS. 15 to 18 are cross-sectional views illustrating a method of manufacturing the display substrate of FIG. 14.

Referring to FIG. 15, a gate metal layer is disposed on a base substrate 1110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 and a third gate electrode GE3.

The base substrate 1110 may include a material which has relatively high transmittance, thermal resistance, and chemical resistance. In an exemplary embodiment the base substrate 1110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 1120 is disposed on the base substrate 1110 on which gate pattern is provided. The first insulation layer 1120 is disposed on the gate pattern. The first insulation layer 1120 covers and insulates the first storage line Cst1, the gate line GL, the first gate electrode GE1, the second gate electrode GE2 and the third gate electrode GE3.

Figure 16:
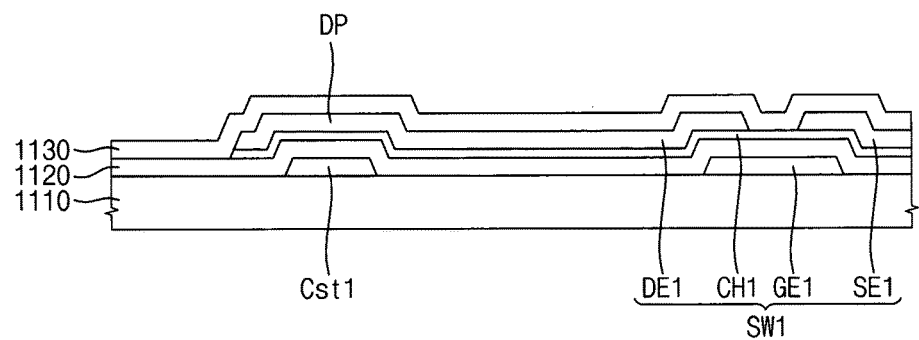

Referring to FIG. 16, a semiconductor layer and a data metal layer are disposed on the base substrate 1110 on which the first insulation layer 1120 is provided. Thereafter, the semiconductor layer and the data metal layer may be partially etched by a photolithography process or an etching process using an additional etching mask. Hence, a channel layer including a first channel portion CH1, a data metal pattern and a repair electrode DP are provided.

In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The data metal pattern have a single layer structure including copper (Cu), silver (Ag), chrome (Cr), molybdenum (Mo), aluminum (Al), titanium (Ti), manganese (Mn) and a combination thereof. In an exemplary embodiment, the data metal pattern may have a multi layer structure having a plurality of layers including materials different each other.

The repair electrode DP is disposed on the same layer as the first drain electrode DE1. The repair electrode DP is electrically connected to the first drain electrode DE1. The repair electrode DP extends in the second direction D2. The repair electrode DP overlaps the first storage line Cst1.

A second insulation layer 1130 is disposed on the base substrate 1110 on which the data pattern and the channel layer are provided.

In an exemplary embodiment, the second insulation layer 1130 may be provided by a spin coating process, a printing process, a sputtering process, a CVD process, an ALD process, a PECVD process, an HDP-CVD process or a vacuum evaporation process in accordance with ingredients included in the second insulation layer 1130, for example. The second insulation layer 1130 is disposed on the data pattern. The second insulation layer 1130 covers and insulates the first drain electrode DE1, the first source electrode SE1, the second source electrode SE2, the second drain electrode DE2, the third source electrode SE3, the third drain electrode DE3 and the data line DL.

Figure 17:
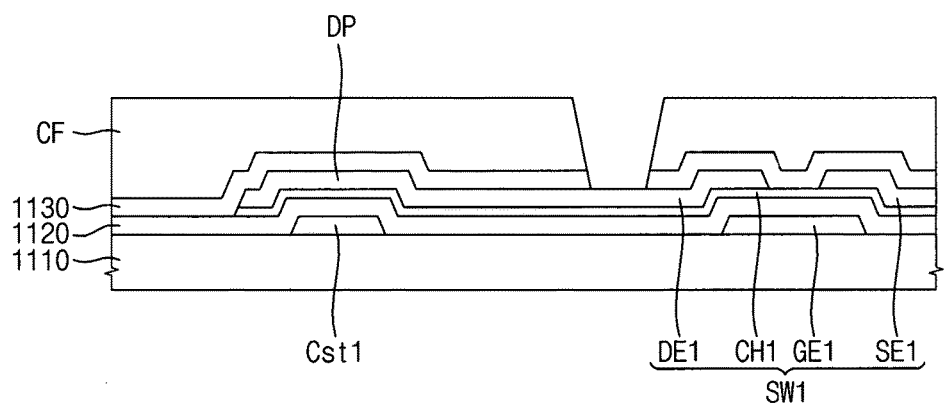

Referring to FIG. 17, an organic layer CF is disposed on the base substrate 1110 on which the second insulation layer 1130 is provided. In an exemplary embodiment, the organic layer CF may be a color filter layer, for example. A photoresist is disposed on the second insulation layer 1130, and then the photoresist is exposed using a mask, and then the photoresist is developed using a developing solution. Hence, the organic layer CF may be provided. Thereafter, the organic layer CF is patterned to define a first contact hole CNT1.

The organic layer CF is disposed on the second insulation layer 1130. When the organic layer CF is color filter layer, the color filter layer supplies colors to the light passing through the liquid crystal layer. The color filter layer may include a red color filter layer, a green color filter layer and a blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 18:
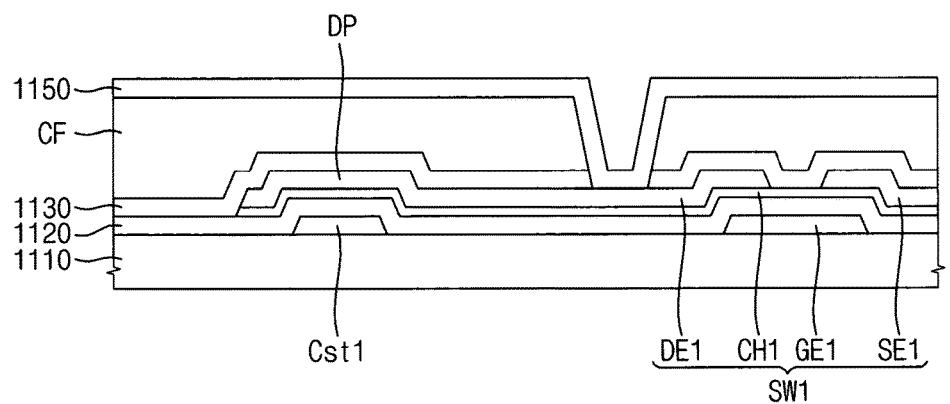

Referring to FIG. 18, a transparent conductive layer 1150 is disposed on the base substrate 1110 on which the organic layer CF is provided.

In an exemplary embodiment, the transparent conductive layer 1150 may include a transparent conductive material, such as ITO and IZO. In an exemplary embodiment, the transparent conductive layer 1150 may include titanium (Ti) and/or molybdenum titanium (MoTi), for example.

Referring to FIG. 14, the transparent conductive layer 1150 is patterned to form the shielding electrode SC and the pixel electrode. The pixel electrode may include the highpixel electrode PE1 and the low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

Figure 19:
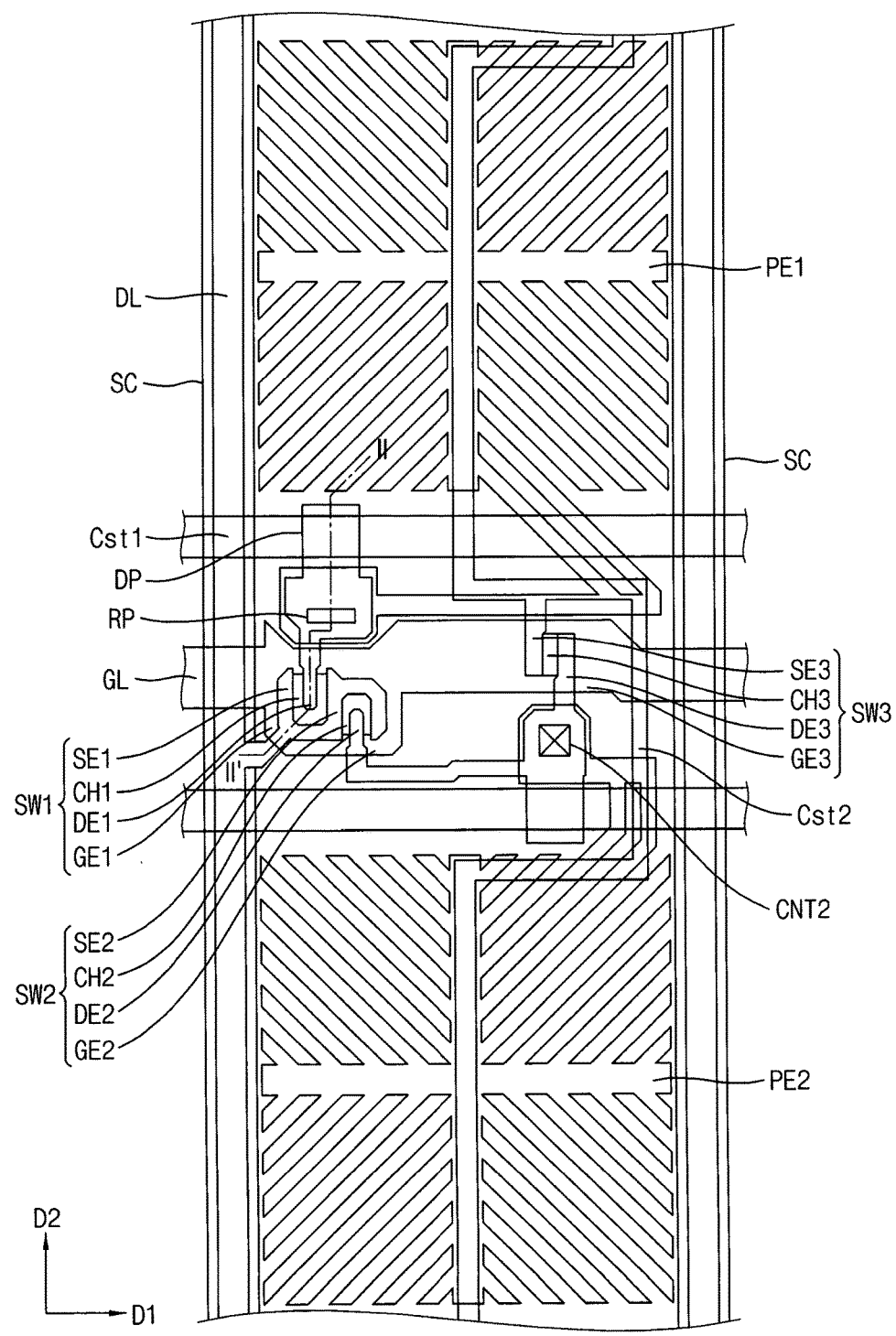
FIG. 19 is a plan view illustrating an exemplary embodiment of a display substrate repaired by a method of repairing a display substrate according to the invention.
Figure 20:
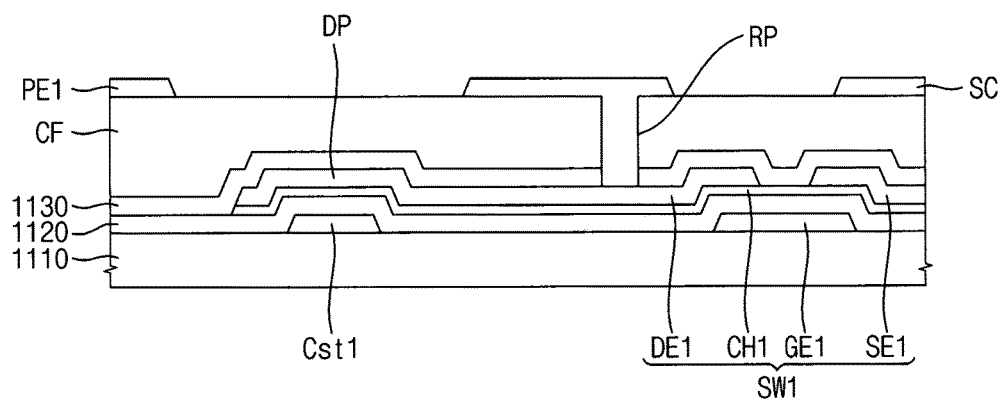
FIG. 20 is a cross-sectional view taken along line II-IF of FIG. 19.

FIG. 19 is a plan view illustrating a display substrate repaired by a method of repairing a display substrate according to an exemplary embodiment of the invention. FIG. 20 is a cross-sectional view taken along line II-IF of FIG. 19.

Referring to FIGS. 19 and 20, when a defect of the display substrate is a defect which is caused by non-forming of a contact hole connecting the first drain electrode DE1 and the high pixel electrode PE1, a display substrate repaired by a method of repairing a display substrate according to an exemplary embodiment of the invention is illustrated.

When a defect of the display substrate is a defect which is caused by non-forming of a contact hole connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

A laser beam is irradiated to an overlapping region of the first drain electrode DE1 and the high pixel electrode PE1, and thus a repair point RP is provided. The first drain electrode DE1 is electrically connected to the high pixel electrode PE1 by the repair point RP. Therefore, a display substrate having a defect which is caused by non-forming of a contact hole connecting the first drain electrode DE1 and the high pixel electrode PE1 may be repaired.

Figure 21:
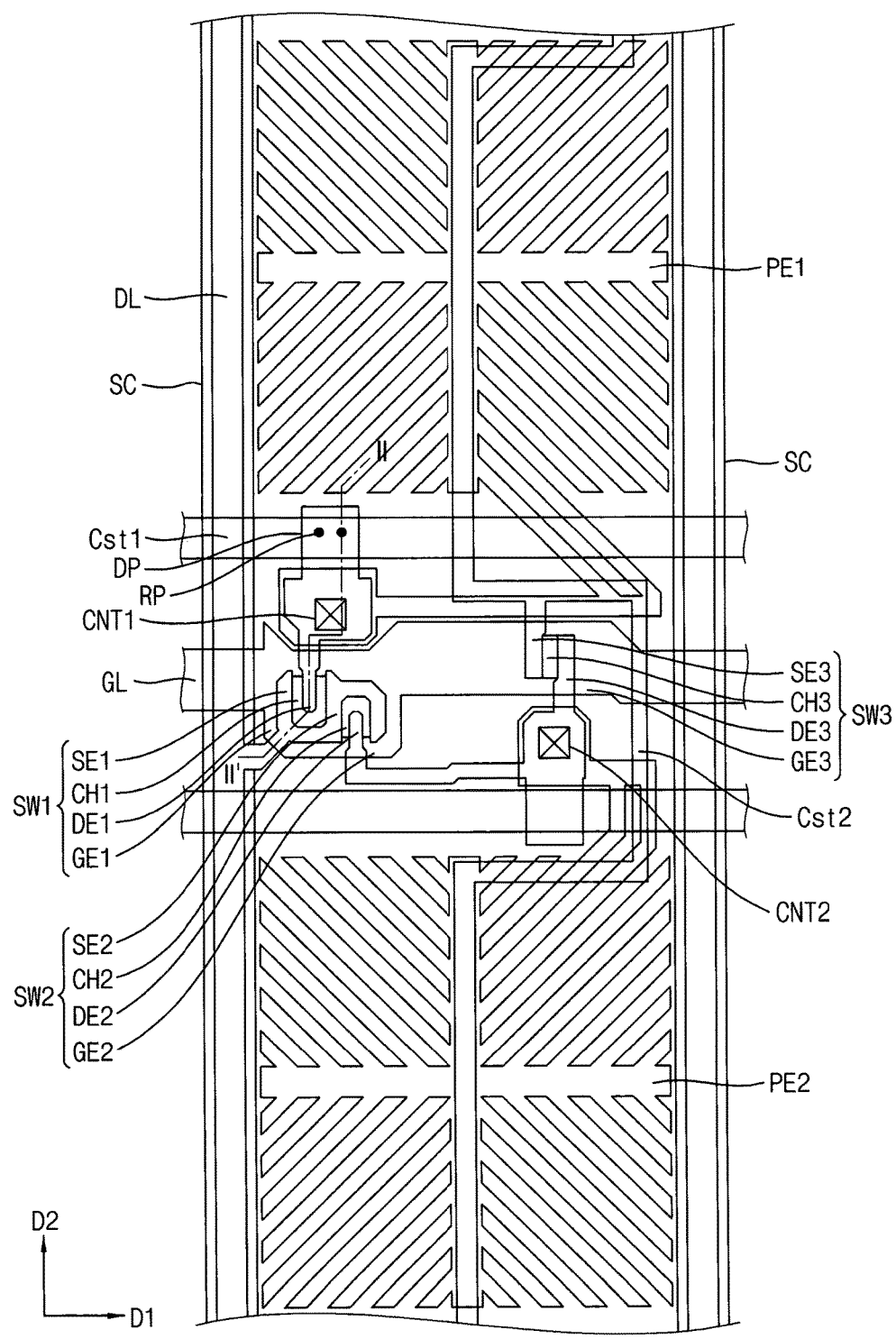
FIG. 21 is a plan view illustrating an exemplary embodiment of a display substrate repaired by a method of repairing a display substrate according to the invention.
Figure 22:
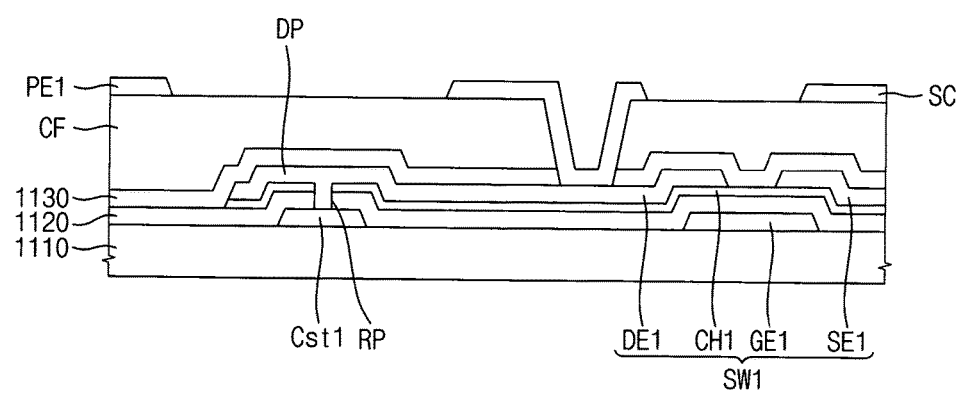
FIG. 22 is a cross-sectional view taken along line II-IF of FIG. 21.

FIG. 21 is a plan view illustrating a display substrate repaired by a method of repairing a display substrate according to an exemplary embodiment of the invention. FIG. 22 is a cross-sectional view taken along line II-II' of FIG. 21.

Referring to FIGS. 21 and 22, when a defect of the display substrate is a defect which needs darkening of a defective pixel to repair the defect, a display substrate repaired by a method of repairing a display substrate according to an exemplary embodiment of the invention is illustrated.

When a defect of the display substrate is a defect which needs darkening of a defective pixel to repair the defect, the repair electrode DP and the first storage line Cst1 are enforcedly shorted for repairing the defective pixel. In an exemplary embodiment, the process of enforcedly shorting the repair electrode DP and the first storage line Cst1 may be performed using a laser beam, for example.

A laser beam is irradiated to an overlapping region of the repair electrode DP and the first storage line Cst1, and thus a repair point RP is provided. The repair electrode DP is electrically connected to the first storage line Cst1 by the repair point RP. In addition, the first drain electrode DE1 is electrically connected to the repair electrode DP. Therefore, the first drain electrode DE1 and the first storage line Cst1 are shorted, and thus the high pixel electrode PE1 may be darkened.

Figure 23:
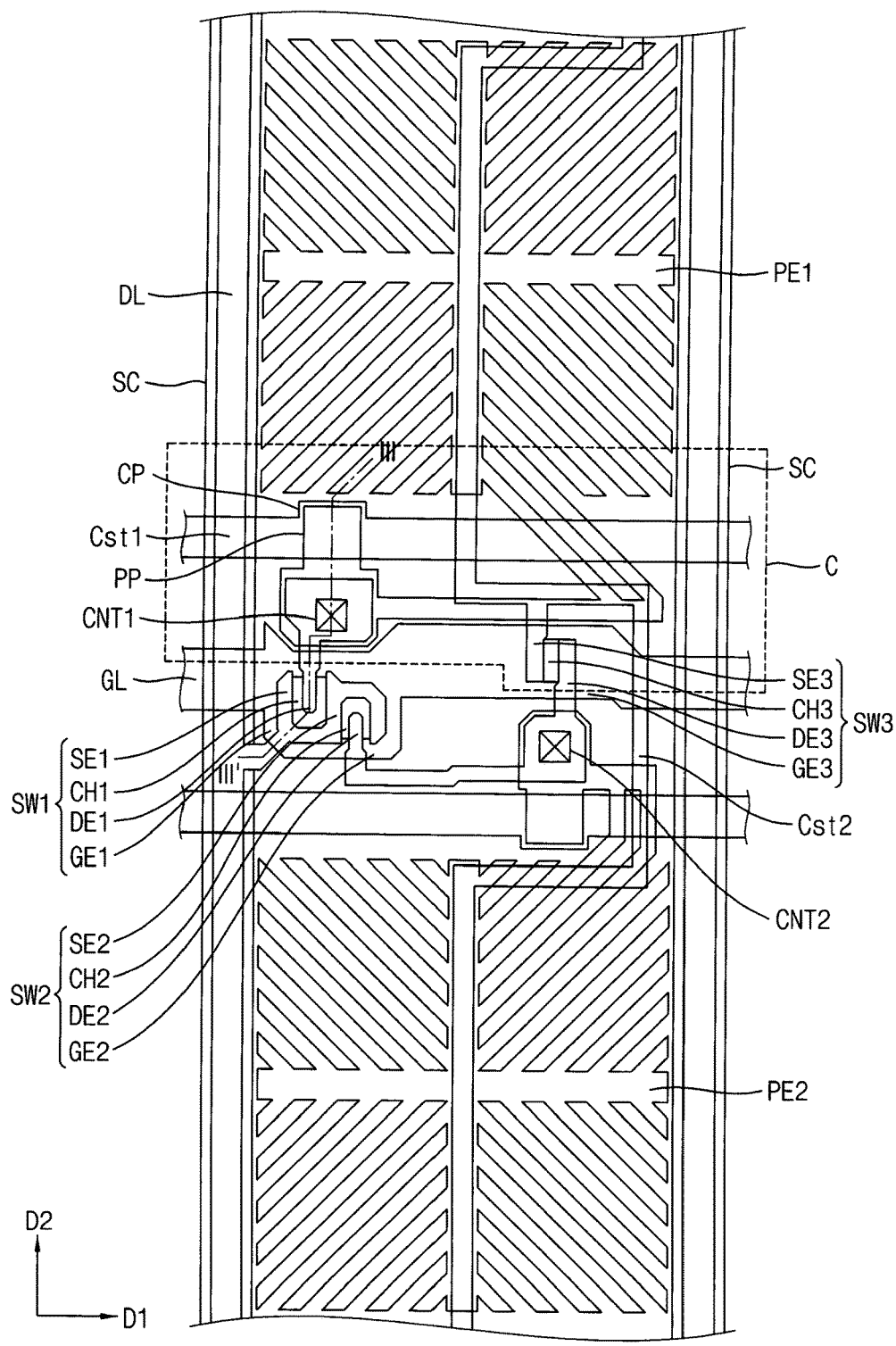
FIG. 23 is a plan view illustrating an exemplary embodiment of a display substrate according to the invention.
Figure 24:
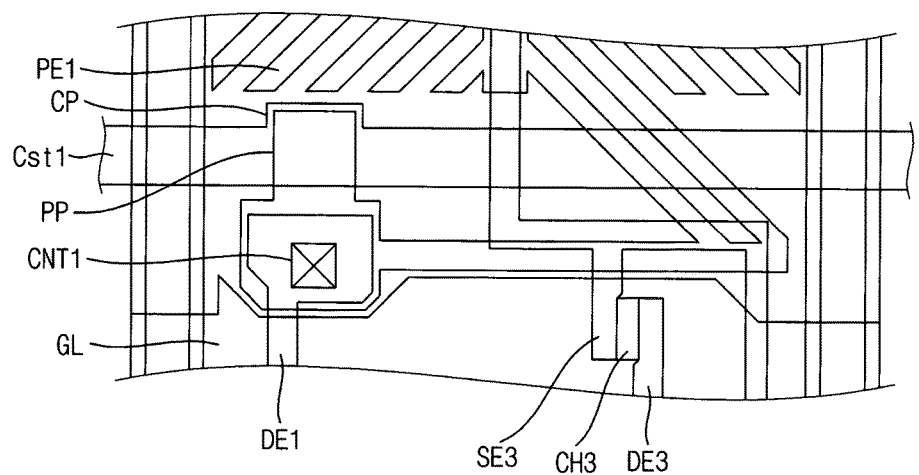
FIG. 24 is a plan view magnifying 'C' portion of FIG. 23.
Figure 25:
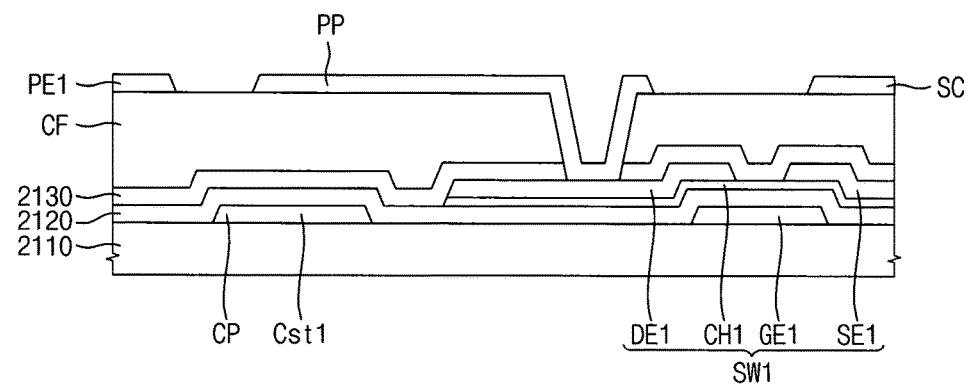
FIG. 25 is a cross-sectional view taken along line of FIG. 23.

FIG. 23 is a plan view illustrating a display substrate according to an exemplary embodiment of the invention. FIG. 24 is a plan view magnifying 'C' portion of FIG. 23. FIG. 25 is a cross-sectional view taken along line of FIG. 23.

Referring to FIGS. 23 to 25, a display substrate includes a gate line GL, a data line DL, a first storage line Cst1, a second storage line Cst2, a shielding electrode SC, a repair electrode PP, a first switching element SW1, a second switching element SW2, a third switching element SW3, a high-pixel electrode PE1 and a low-pixel electrode PE2.

The gate line GL extends in a first direction D1. In an exemplary embodiment, the gate line GL may have a single layer structure including copper (Cu), silver (Ag), chrome (Cr), molybdenum (Mo), aluminum (Al), titanium (Ti), manganese (Mn) and a combination thereof, for example. In an exemplary embodiment, the gate line GL may have a multi layer structure having a plurality of layers including materials different each other. In an exemplary embodiment, the gate line GL may include a copper layer and a titanium layer disposed on and/or under the copper layer, for example. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is provided from the same layer as the gate line GL. Thus, the first storage line Cst1 may be disposed on the same layer as the gate line GL. In an exemplary embodiment, the first storage line Cst1 may have a single layer structure including copper (Cu), silver (Ag), chrome (Cr), molybdenum (Mo), aluminum (Al), titanium (Ti), manganese (Mn) and a combination thereof, for example. In an exemplary embodiment, the first storage line Cst1 may have a multi layer structure having a plurality of layers including materials different each other. In an exemplary embodiment, the first storage line Cst1 may include a copper layer and a titanium layer disposed on and/or under the copper layer, for example.

A first insulation layer 2120 is disposed on the gate line GL and the first storage line Cst1. The first insulation layer 2120 may include an inorganic material such as silicon oxide (SiOx) and/or silicon nitride (SiNx). In an exemplary embodiment, the first insulation layer 2120 includes silicon oxide (SiOx), and may have a thickness of about 500 Å, for example. In an exemplary embodiment, the first insulation layer 2120 may include a plurality of layers including different materials from each other.

The data line DL is disposed on first insulation layer 2120. The data line DL extends in a second direction D2 crossing the first direction D1. The data line DL crosses the gate line GL. In an exemplary embodiment, the data line DL may have a single layer structure including copper (Cu), silver (Ag), chrome (Cr), molybdenum (Mo), aluminum (Al), titanium (Ti), manganese (Mn) and a combination thereof, for example. In an exemplary embodiment, the data line DL may have a multi layer structure having a plurality of layers including materials different each other. In an exemplary embodiment, the data line DL may include a copper layer and a titanium layer disposed on and/or under the copper layer, for example. The data line DL may be electrically connected to a first source electrode SE1 of the first switching element SW1, and a second source electrode SE2 of the second switching element SW2.

The second storage line Cst2 is provided from the same layer as the data line DL. Thus, the second storage line Cst2 may be disposed on the same layer as the data line DL. In an exemplary embodiment, the second storage line Cst2 may have a single layer structure including copper (Cu), silver (Ag), chrome (Cr), molybdenum (Mo), aluminum (Al), titanium (Ti), manganese (Mn) and a combination thereof. In an exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 may be electrically connected to a third source electrode SE3 of the third switching element SW3.

A second insulation layer 2130 is disposed on the data line DL and the second storage line Cst2. The second insulation layer 2130 may include an inorganic material such as silicon oxide (SiOx) and/or silicon nitride (SiNx). In an exemplary embodiment, the second insulation layer 2130 includes silicon oxide (SiOx), and may have a thickness of about 500 Å, for example. In an exemplary embodiment, the second insulation layer 2130 may include a plurality of layers including different materials from each other.

An organic layer CF is disposed on the second insulation layer 2130. The organic layer CF planarizes an upper surface of the substrate so that problems due to the step such as disconnection of a signal line may be prevented. The organic layer CF may be an insulation layer including an organic material. In an exemplary embodiment, the organic layer CF may a color filter layer, for example.

A shielding electrode SC is disposed on the organic layer CF. In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

A display panel according to another exemplary embodiment may include a display substrate, a facing substrate facing the display substrate and liquid crystal layer interposed between the display substrate and the facing substrate. The facing substrate may include a common electrode. The common electrode is disposed on an entirely region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. Thus, a direction of the molecules of the liquid crystal may be equal to a direction of a polarizer, so that a region on the shielding electrode SC may be black. Therefore, a light may be blocked without a black matrix.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The high-pixel electrode PE1 is disposed adjacent to the gate line GL in the second direction D2, and between the data lines DL in the first direction D1. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL in the first direction D1. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. In an exemplary embodiment, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel, for example.

The first switching element SW1 includes the first gate electrode GE1, the first source electrode SE1, the first drain electrode DE1 and a first channel portion CH1 connecting the first source electrode SE1 to the first drain electrode DE1.

In an exemplary embodiment, the first channel portion CH1 may include a semiconductor layer including amorphous silicon (a-Si:H) and an ohmic contact layer including n+ amorphous silicon (n+ a-Si:H), for example. In an exemplary embodiment, the first channel portion CH1 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The second switching element SW2 includes the second gate electrode GE2, the second source electrode SE2, the second drain electrode DE2 and a second channel portion CH2 connecting the second source electrode SE2 to the second drain electrode DE2.

In an exemplary embodiment, the second channel portion CH2 may include a semiconductor layer including amorphous silicon (a-Si:H) and an ohmic contact layer including n+ amorphous silicon (n+ a-Si:H), for example. In an exemplary embodiment, the second channel portion CH2 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The third switching element SW3 includes the third gate electrode GE3, the third source electrode SE3, the third drain electrode DE3 and a third channel portion CH3 connecting the third source electrode SE3 to the third drain electrode DE3.

In an exemplary embodiment, the third channel portion CH3 may include a semiconductor layer including amorphous silicon (a-Si:H) and an ohmic contact layer including n+ amorphous silicon (n+ a-Si:H), for example. In an exemplary embodiment, the third channel portion CH3 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

A display substrate according to an exemplary embodiment of the invention includes a repair electrode PP. The repair electrode PP is disposed on the same layer as the high pixel electrode PE1. The repair electrode PP is electrically connected to the high pixel electrode PE1. The repair electrode PP extends in the second direction D2. The repair electrode PP overlaps the first storage line Cst1. When a defect of the display substrate is a defect which needs darkening of a defective pixel to repair the defect, the repair electrode PP and the first storage line Cst1 are enforcedly shorted for repairing the defective pixel. In an exemplary embodiment, the process of enforcedly shorting the repair electrode PP and the first storage line Cst1 may be performed using a laser beam, for example.

The first storage line Cst1 includes a protrusion portion CP protruding along the second direction D2 and overlapping with the repair electrode PP. The repair electrode PP is disposed in the protrusion portion CP in a plan view.

When a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

According to the exemplary embodiment, when a defect of the display substrate is a defect which needs darkening of a defective pixel to repair the defect, the repair electrode PP and the first storage line Cst1 are enforcedly shorted for repairing the defective pixel. In addition, when a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. That is, a selective repairing a display substrate according to a defect of the display substrate may be performed.

FIGS. 26 to 29 are cross-sectional views illustrating a method of manufacturing the display substrate of FIG. 25.

Figure 26:
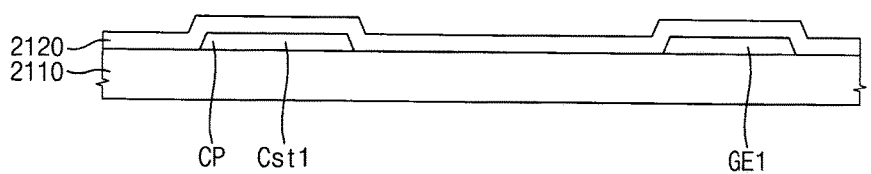
FIGS. 26 to 29 are cross-sectional views illustrating a method of manufacturing the display substrate of FIG. 25.

Referring to FIG. 26, a gate metal layer is disposed on a base substrate 2110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 and a third gate electrode GE3.

The base substrate 2110 may include a material which has relatively high transmittance, thermal resistance, and chemical resistance. In an exemplary embodiment the base substrate 2110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first storage line Cst1 includes a protrusion portion CP protruding along the second direction D2 and overlapping with the repair electrode PP.

The first insulation layer 2120 is disposed on the base substrate 2110 on which gate pattern is provided. The first insulation layer 2120 is disposed on the gate pattern. The first insulation layer 2120 covers and insulates the first storage line Cst1, the gate line GL, the first gate electrode GE1, the second gate electrode GE2 and the third gate electrode GE3.

Figure 27:
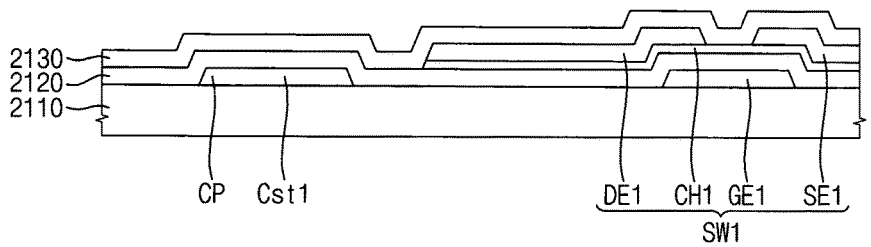

Referring to FIG. 27, a semiconductor layer and a data metal layer are disposed on the base substrate 2110 on which the first insulation layer 2120 is provided. Thereafter, the semiconductor layer and the data metal layer may be partially etched by a photolithography process or an etching process using an additional etching mask. Hence, a channel layer including a first channel portion CH1, a data metal pattern and a repair electrode PP are provided.

In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The data metal pattern have a single layer structure including copper (Cu), silver (Ag), chrome (Cr), molybdenum (Mo), aluminum (Al), titanium (Ti), manganese (Mn) and a combination thereof. In an exemplary embodiment, the data metal pattern may have a multi layer structure having a plurality of layers including materials different each other.

A second insulation layer 2130 is disposed on the base substrate 2110 on which the data pattern and the channel layer are provided.

In an exemplary embodiment, the second insulation layer 2130 may be provided by a spin coating process, a printing process, a sputtering process, a CVD process, an ALD process, a PECVD process, an HDP-CVD process or a vacuum evaporation process in accordance with ingredients included in the second insulation layer 2130, for example. The second insulation layer 2130 is disposed on the data pattern. The second insulation layer 2130 covers and insulates the first drain electrode DE1, the first source electrode SE1, the second source electrode SE2, the second drain electrode DE2, the third source electrode SE3, the third drain electrode DE3 and the data line DL.

Figure 28:
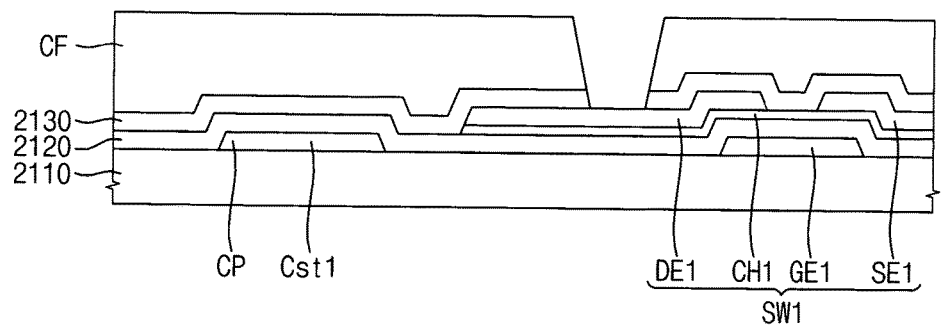

Referring to FIG. 28, an organic layer CF is disposed on the base substrate 2110 on which the second insulation layer 2130 is provided. The organic layer CF may be a color filter layer. A photoresist is disposed on the second insulation layer 2130, and then the photoresist is exposed using a mask, and then the photoresist is developed using a developing solution. Hence, the organic layer CF may be provided. Thereafter, the organic layer CF is patterned to define a first contact hole CNT1.

The organic layer CF is disposed on the second insulation layer 2130. When the organic layer CF is color filter layer, the color filter layer supplies colors to the light passing through the liquid crystal layer. The color filter layer may include a red color filter layer, a green color filter layer and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 29:
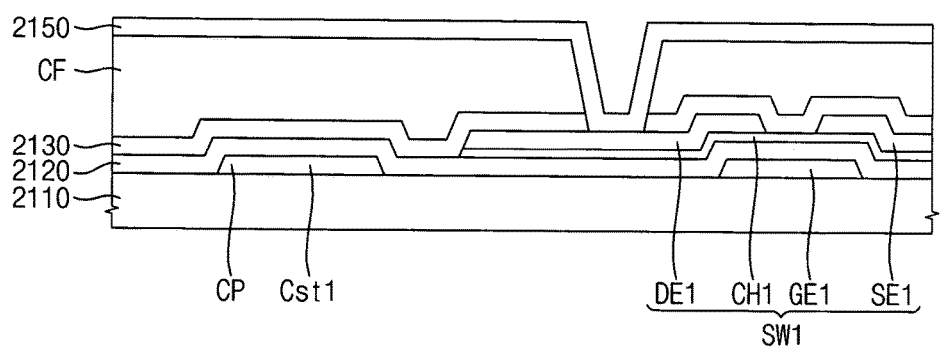

Referring to FIG. 29, a transparent conductive layer 2150 is disposed on the base substrate 2110 on which the organic layer CF is provided.

In an exemplary embodiment, the transparent conductive layer 2150 may include a transparent conductive material, such as ITO and IZO. In an exemplary embodiment, the transparent conductive layer 2150 may include titanium (Ti) and/or molybdenum titanium (MoTi), for example.

Referring to FIG. 25, the transparent conductive layer 2150 is patterned to form the shielding electrode SC, the pixel electrode and a repair electrode PP. The pixel electrode may include the high-pixel electrode PE1 and the low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The repair electrode PP is disposed on the same layer as the high pixel electrode PE1. The repair electrode PP is electrically connected to the high pixel electrode PE1. The repair electrode PP extends in the second direction D2. The repair electrode PP overlaps the first storage line Cst1.

Figure 30:
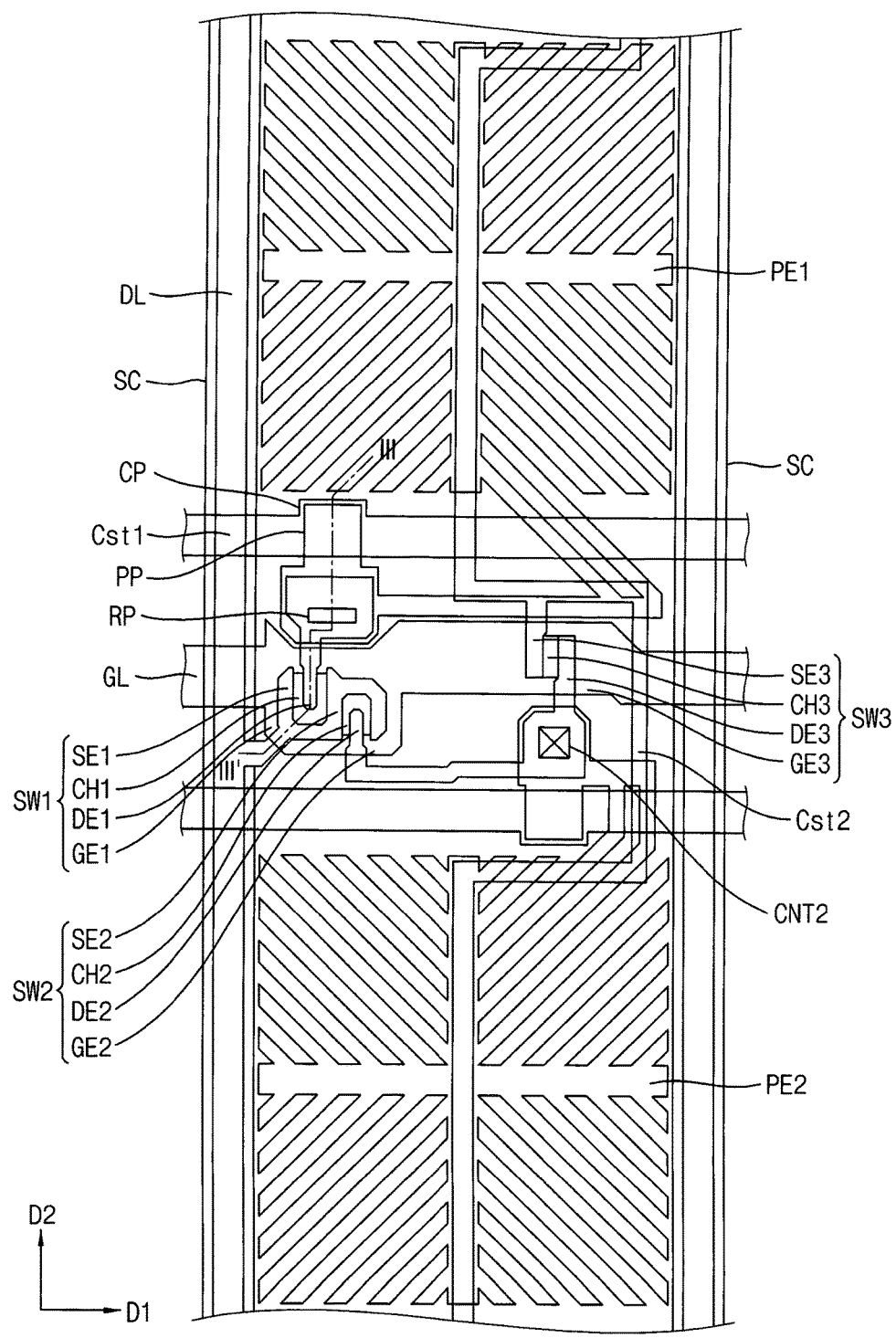
FIG. 30 is a plan view illustrating an exemplary embodiment of a display substrate repaired by a method of repairing a display substrate according to the invention.
Figure 31:
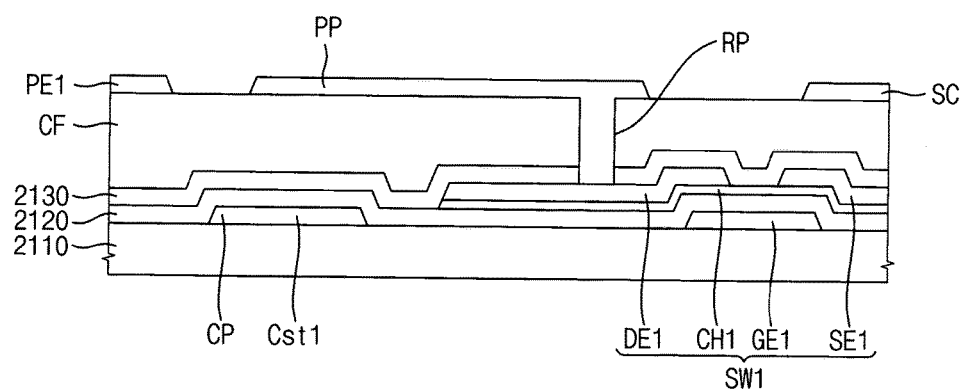
FIG. 31 is a cross-sectional view taken along line of FIG. 30.

FIG. 30 is a plan view illustrating a display substrate repaired by a method of repairing a display substrate according to an exemplary embodiment of the invention. FIG. 31 is a cross-sectional view taken along line of FIG. 30.

Referring to FIGS. 30 and 31, when a defect of the display substrate is a defect which is caused by non-forming of a contact hole connecting the first drain electrode DE1 and the high pixel electrode PE1, a display substrate repaired by a method of repairing a display substrate according to an exemplary embodiment of the invention is illustrated.

When a defect of the display substrate is a defect which is caused by non-forming of a contact hole connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

A laser beam is irradiated to an overlapping region of the first drain electrode DE1 and the high pixel electrode PE1, and thus a repair point RP is provided. The first drain electrode DE1 is electrically connected to the high pixel electrode PE1 by the repair point RP. Therefore, a display substrate having a defect which is caused by non-forming of a contact hole connecting the first drain electrode DE1 and the high pixel electrode PE1 may be repaired.

Figure 32:
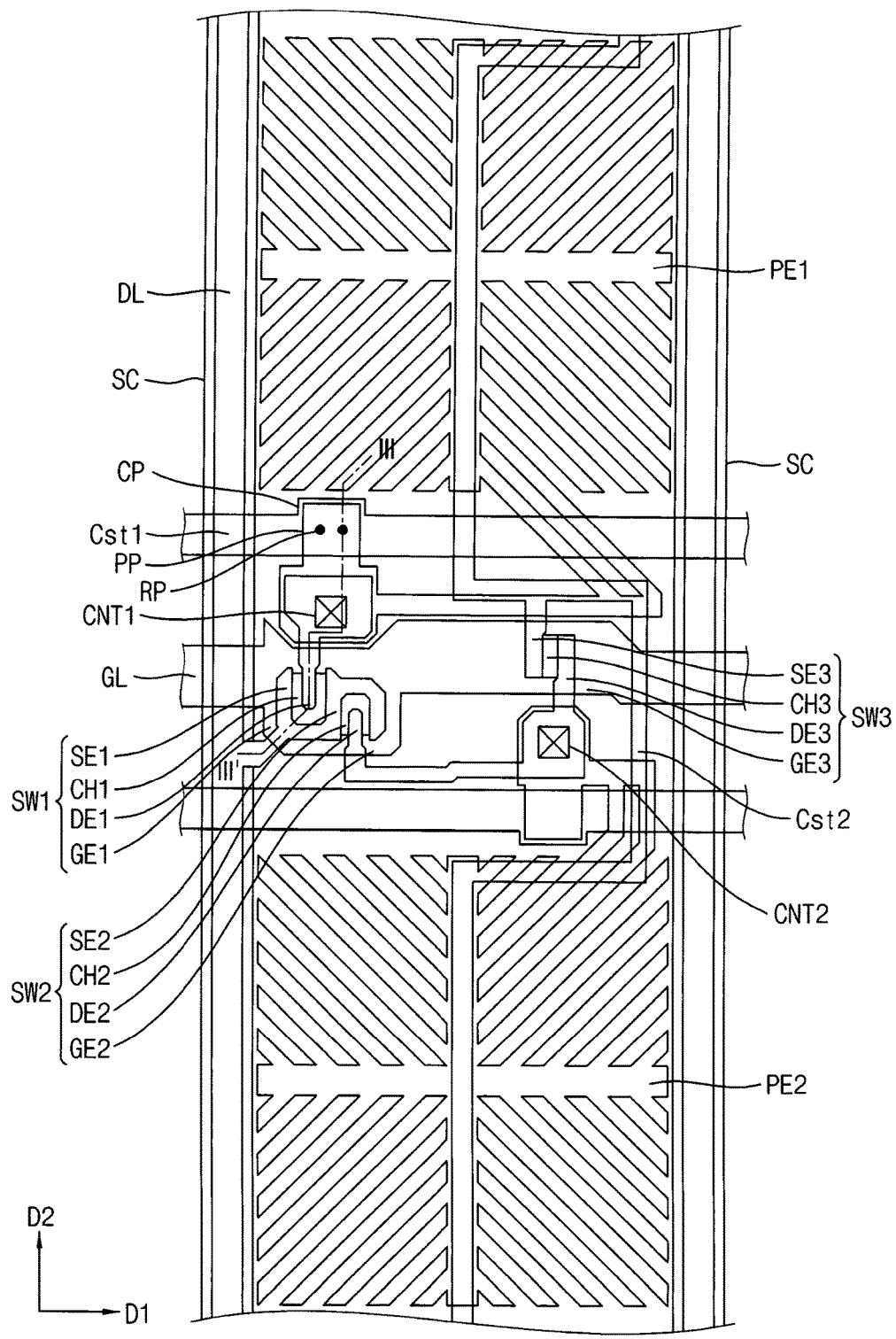
FIG. 32 is a plan view illustrating an exemplary embodiment of a display substrate repaired by a method of repairing a display substrate according to the invention.
Figure 33:
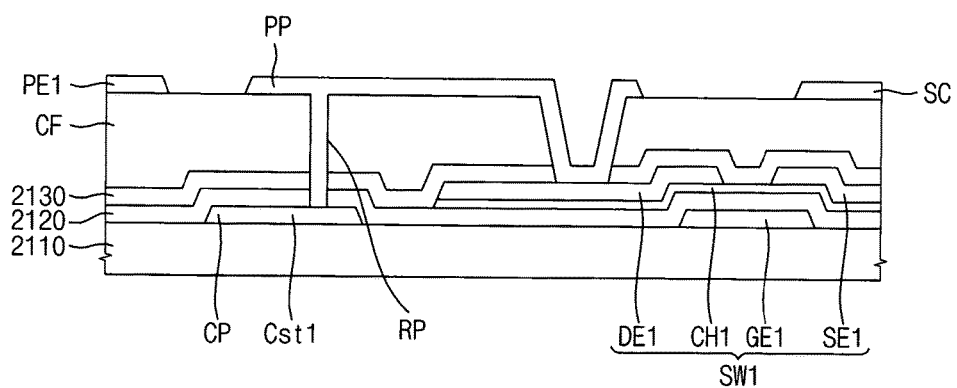
FIG. 33 is a cross-sectional view taken along line of FIG. 32.

FIG. 32 is a plan view illustrating a display substrate repaired by a method of repairing a display substrate according to an exemplary embodiment of the invention. FIG. 33 is a cross-sectional view taken along line of FIG. 32.

Referring to FIGS. 32 and 33, when a defect of the display substrate is a defect which needs darkening of a defective pixel to repair the defect, a display substrate repaired by a method of repairing a display substrate according to an exemplary embodiment of the invention is illustrated.

When a defect of the display substrate is a defect which needs darkening of a defective pixel to repair the defect, the repair electrode PP and the first storage line Cst1 are enforcedly shorted for repairing the defective pixel. In an exemplary embodiment, the process of enforcedly shorting the repair electrode PP and the first storage line Cst1 may be performed using a laser beam, for example.

A laser beam is irradiated to an overlapping region of the repair electrode PP and the first storage line Cst1, and thus a repair point RP is provided. The repair electrode PP is electrically connected to the first storage line Cst1 by the repair point RP. In addition, the first drain electrode DE1 is electrically connected to the repair electrode PP. Therefore, the first drain electrode DE1 and the first storage line Cst1 are shorted, and thus the high pixel electrode PE1 may be darkened.

Figure 34:
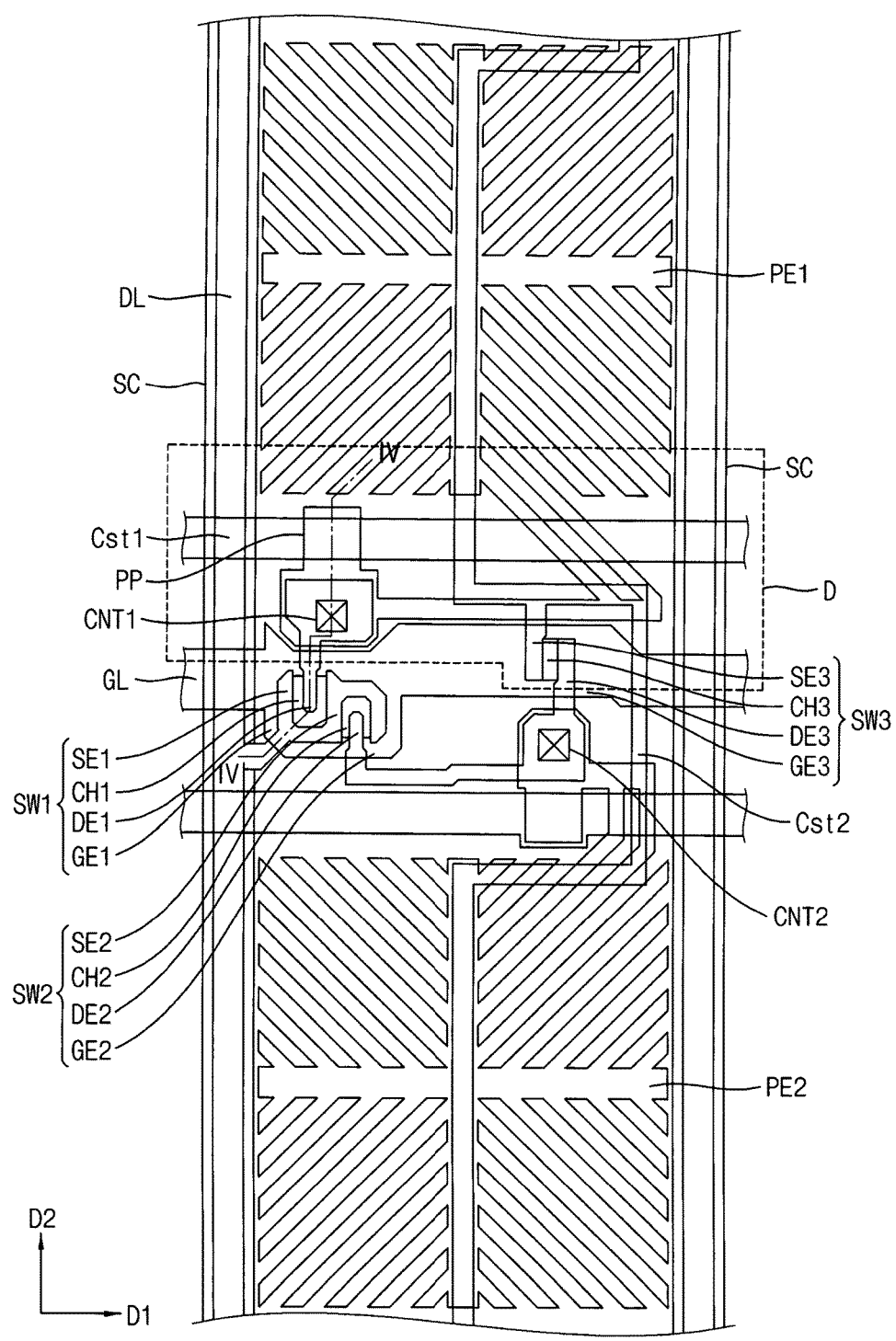
FIG. 34 is a plan view illustrating an exemplary embodiment of a display substrate according to the invention.
Figure 35:
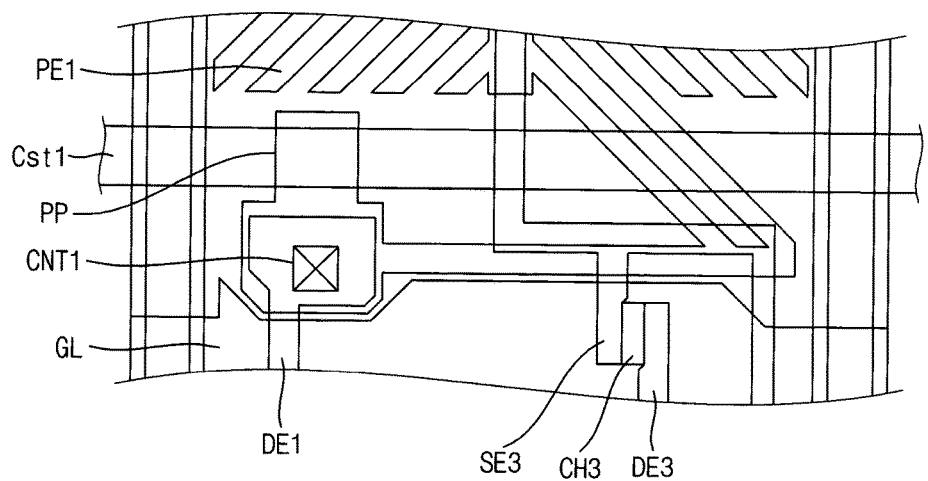
FIG. 35 is a plan view magnifying 'D' portion of FIG. 34.
Figure 36:
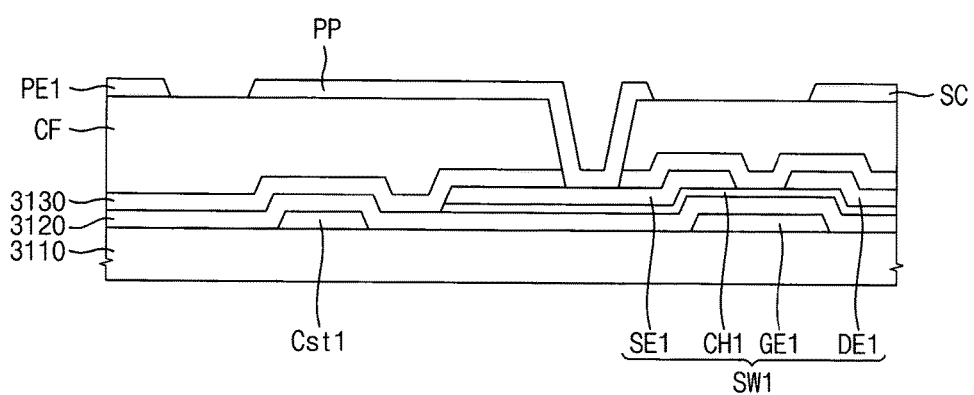
FIG. 36 is a cross-sectional view taken along line IV-IV' of FIG. 34.

FIG. 34 is a plan view illustrating a display substrate according to an exemplary embodiment of the invention. FIG. 35 is a plan view magnifying 'D' portion of FIG. 34. FIG. 36 is a cross-sectional view taken along line IV-IV' of FIG. 34.

Referring to FIGS. 34 to 36, a display substrate includes a gate line GL, a data line DL, a first storage line Cst1, a second storage line Cst2, a shielding electrode SC, a repair electrode PP, a first switching element SW1, a second switching element SW2, a third switching element SW3, a high-pixel electrode PE1 and a low-pixel electrode PE2.

The gate line GL extends in a first direction D1. In an exemplary embodiment, the gate line GL may have a single layer structure including copper (Cu), silver (Ag), chrome (Cr), molybdenum (Mo), aluminum (Al), titanium (Ti), manganese (Mn) and a combination thereof, for example. In an exemplary embodiment, the gate line GL may have a multi layer structure having a plurality of layers including materials different each other. In an exemplary embodiment, the gate line GL may include a copper layer and a titanium layer disposed on and/or under the copper layer, for example. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps the high-pixel electrode PE1. The first storage line Cst1 is provided from the same layer as the gate line GL. Thus, the first storage line Cst1 may be disposed on the same layer as the gate line GL. In an exemplary embodiment, the first storage line Cst1 may have a single layer structure including copper (Cu), silver (Ag), chrome (Cr), molybdenum (Mo), aluminum (Al), titanium (Ti), manganese (Mn) and a combination thereof, for example. In an exemplary embodiment, the first storage line Cst1 may have a multi layer structure having a plurality of layers including materials different each other. In an exemplary embodiment, the first storage line Cst1 may include a copper layer and a titanium layer disposed on and/or under the copper layer, for example.

A first insulation layer 3120 is disposed on the gate line GL and the first storage line Cst1. The first insulation layer 3120 may include an inorganic material such as silicon oxide (SiOx) and/or silicon nitride (SiNx). In an exemplary embodiment, the first insulation layer 3120 includes silicon oxide (SiOx), and may have a thickness of about 500 Å, for example. In an exemplary embodiment, the first insulation layer 3120 may include a plurality of layers including different materials from each other.

The data line DL is disposed on first insulation layer 3120. The data line DL extends in a second direction D2 crossing the first direction D1. The data line DL crosses the gate line GL. In an exemplary embodiment, the data line DL may have a single layer structure including copper (Cu), silver (Ag), chrome (Cr), molybdenum (Mo), aluminum (Al), titanium (Ti), manganese (Mn) and a combination thereof, for example. In an exemplary embodiment, the data line DL may have a multi layer structure having a plurality of layers including materials different each other. In an exemplary embodiment, the data line DL may include a copper layer and a titanium layer disposed on and/or under the copper layer, for example. The data line DL may be electrically connected to a first source electrode SE1 of the first switching element SW1, and a second source electrode SE2 of the second switching element SW2.

The second storage line Cst2 is provided from the same layer as the data line DL. Thus, the second storage line Cst2 may be disposed on the same layer as the data line DL. In an exemplary embodiment, the second storage line Cst2 may have a single layer structure including copper (Cu), silver (Ag), chrome (Cr), molybdenum (Mo), aluminum (Al), titanium (Ti), manganese (Mn) and a combination thereof. In an exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 may be electrically connected to a third source electrode SE3 of the third switching element SW3.

A second insulation layer 3130 is disposed on the data line DL and the second storage line Cst2. The second insulation layer 3130 may include an inorganic material such as silicon oxide (SiOx) and/or silicon nitride (SiNx). In an exemplary embodiment, the second insulation layer 3130 includes silicon oxide (SiOx), and may have a thickness of about 500 Å, for example. In an exemplary embodiment, the second insulation layer 3130 may include a plurality of layers including different materials from each other.

An organic layer CF is disposed on the second insulation layer 3130. The organic layer CF planarizes an upper surface of the substrate so that problems due to the step such as disconnection of a signal line may be prevented. The organic layer CF may be an insulation layer including an organic material. In an exemplary embodiment, the organic layer CF may a color filter layer, for example.

A shielding electrode SC is disposed on the organic layer CF. In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

A display panel according to another exemplary embodiment may include a display substrate, a facing substrate facing the display substrate and liquid crystal layer interposed between the display substrate and the facing substrate. The facing substrate may include a common electrode. The common electrode is disposed on an entirely region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. Thus, a direction of the molecules of the liquid crystal may be equal to a direction of a polarizer, so that a region on the shielding electrode SC may be black. Therefore, a light may be blocked without a black matrix.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The high-pixel electrode PE1 is disposed adjacent to the gate line GL in the second direction D2, and between the data lines DL in the first direction D1. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL in the first direction D1. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. In an exemplary embodiment, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel, for example.

The first switching element SW1 includes the first gate electrode GE1, the first source electrode SE1, the first drain electrode DE1 and a first channel portion CH1 connecting the first source electrode SE1 to the first drain electrode DE1.

In an exemplary embodiment, the first channel portion CH1 may include a semiconductor layer including amorphous silicon (a-Si:H) and an ohmic contact layer including n+ amorphous silicon (n+ a-Si:H), for example. In an exemplary embodiment, the first channel portion CH1 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The second switching element SW2 includes the second gate electrode GE2, the second source electrode SE2, the second drain electrode DE2 and a second channel portion CH2 connecting the second source electrode SE2 to the second drain electrode DE2.

In an exemplary embodiment, the second channel portion CH2 may include a semiconductor layer including amorphous silicon (a-Si:H) and an ohmic contact layer including n+ amorphous silicon (n+ a-Si:H), for example. In an exemplary embodiment, the second channel portion CH2 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The third switching element SW3 includes the third gate electrode GE3, the third source electrode SE3, the third drain electrode DE3 and a third channel portion CH3 connecting the third source electrode SE3 to the third drain electrode DE3.

In an exemplary embodiment, the third channel portion CH3 may include a semiconductor layer including amorphous silicon (a-Si:H) and an ohmic contact layer including n+ amorphous silicon (n+ a-Si:H), for example. In an exemplary embodiment, the third channel portion CH3 may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

A display substrate according to an exemplary embodiment of the invention includes a repair electrode PP. The repair electrode PP is disposed on the same layer as the high pixel electrode PE1. The repair electrode PP is electrically connected to the high pixel electrode PE1. The repair electrode PP extends in the second direction D2. The repair electrode PP overlaps the first storage line Cst1. When a defect of the display substrate is a defect which needs darkening of a defective pixel to repair the defect, the repair electrode PP and the first storage line Cst1 are enforcedly shorted for repairing the defective pixel. In an exemplary embodiment, the process of enforcedly shorting the repair electrode PP and the first storage line Cst1 may be performed using a laser beam, for example.

When a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

According to the exemplary embodiment, when a defect of the display substrate is a defect which needs darkening of a defective pixel to repair the defect, the repair electrode PP and the first storage line Cst1 are enforcedly shorted for repairing the defective pixel. In addition, when a defect of the display substrate is a defect which is caused by non-forming of a first contact hole CNT1 connecting the first drain electrode DE1 and the high pixel electrode PE1, the first drain electrode DE1 and the high pixel electrode PE1 are enforcedly shorted for repairing the defect. That is, a selective repairing a display substrate according to a defect of the display substrate may be performed.

FIGS. 37 to 40 are cross-sectional views illustrating a method of manufacturing the display substrate of FIG. 36.

Figure 37:
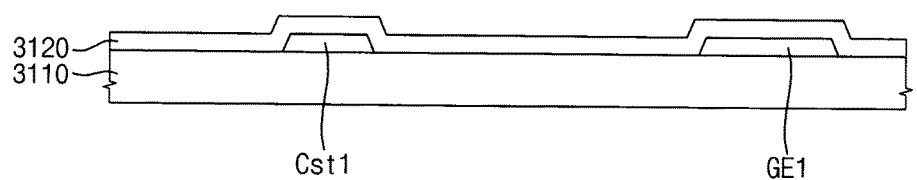
FIGS. 37 to 40 are cross-sectional views illustrating a method of manufacturing the display substrate of FIG. 36.

Referring to FIG. 37, a gate metal layer is disposed on a base substrate 3110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 and a third gate electrode GE3.

The base substrate 3110 may include a material which has relatively high transmittance, thermal resistance, and chemical resistance. In an exemplary embodiment the base substrate 3110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 3120 is disposed on the base substrate 3110 on which gate pattern is provided. The first insulation layer 3120 is disposed on the gate pattern. The first insulation layer 3120 covers and insulates the first storage line Cst1, the gate line GL, the first gate electrode GE1, the second gate electrode GE2 and the third gate electrode GE3.

Figure 38:
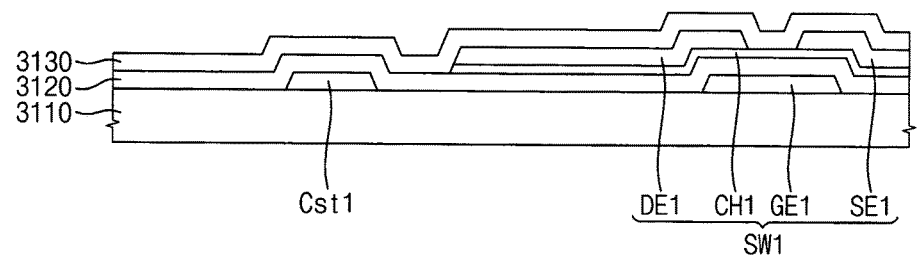

Referring to FIG. 38, a semiconductor layer and a data metal layer are disposed on the base substrate 3110 on which the first insulation layer 3120 is provided. Thereafter, the semiconductor layer and the data metal layer may be partially etched by a photolithography process or an etching process using an additional etching mask. Hence, a channel layer including a first channel portion CH1, a data metal pattern and a repair electrode DP are provided.

In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The data metal pattern have a single layer structure including copper (Cu), silver (Ag), chrome (Cr), molybdenum (Mo), aluminum (Al), titanium (Ti), manganese (Mn) and a combination thereof. In an exemplary embodiment, the data metal pattern may have a multi layer structure having a plurality of layers including materials different each other.

A second insulation layer 3130 is disposed on the base substrate 3110 on which the data pattern and the channel layer are provided.

In an exemplary embodiment, the second insulation layer 3130 may be provided by a spin coating process, a printing process, a sputtering process, a CVD process, an ALD process, a PECVD process, an HDP-CVD process or a vacuum evaporation process in accordance with ingredients included in the second insulation layer 3130, for example. The second insulation layer 3130 is disposed on the data pattern. The second insulation layer 3130 covers and insulates the first drain electrode DE1, the first source electrode SE1, the second source electrode SE2, the second drain electrode DE2, the third source electrode SE3, the third drain electrode DE3 and the data line DL.

Figure 39:
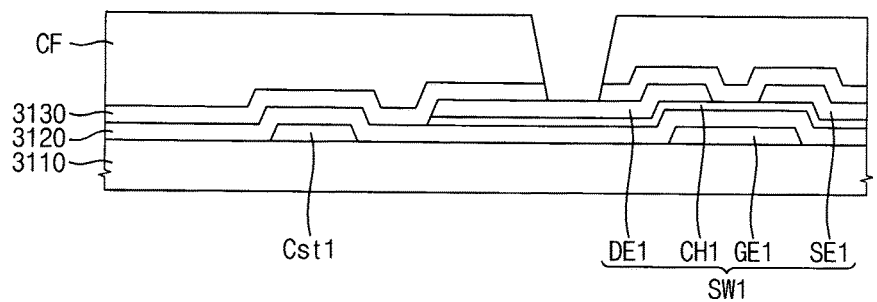

Referring to FIG. 39, an organic layer CF is disposed on the base substrate 3110 on which the second insulation layer 3130 is provided. The organic layer CF may be a color filter layer. A photoresist is disposed on the second insulation layer 130, and then the photoresist is exposed using a mask, and then the photoresist is developed using a developing solution. Hence, the organic layer CF may be provided. Thereafter, the organic layer CF is patterned to define a first contact hole CNT1.

The organic layer CF is disposed on the second insulation layer 3130. When the organic layer CF is color filter layer, the color filter layer supplies colors to the light passing through the liquid crystal layer. The color filter layer may include a red color filter layer, a green color filter layer and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 40:
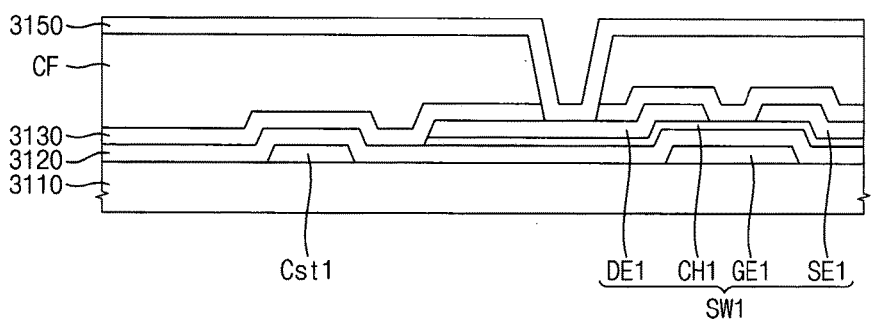

Referring to FIG. 40, a transparent conductive layer 3150 is disposed on the base substrate 3110 on which the organic layer CF is provided.

In an exemplary embodiment, the transparent conductive layer 3150 may include a transparent conductive material, such as ITO and IZO. In an exemplary embodiment, the transparent conductive layer 3150 may include titanium (Ti) and/or molybdenum titanium (MoTi), for example.

Referring to FIG. 36, the transparent conductive layer 3150 is patterned to form the shielding electrode SC, the pixel electrode and a repair electrode PP. The pixel electrode may include the high-pixel electrode PE1 and the low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The repair electrode PP is disposed on the same layer as the high pixel electrode PE1. The repair electrode PP is electrically connected to the high pixel electrode PE1. The repair electrode PP extends in the second direction D2. The repair electrode PP overlaps the first storage line Cst1.

Figure 41:
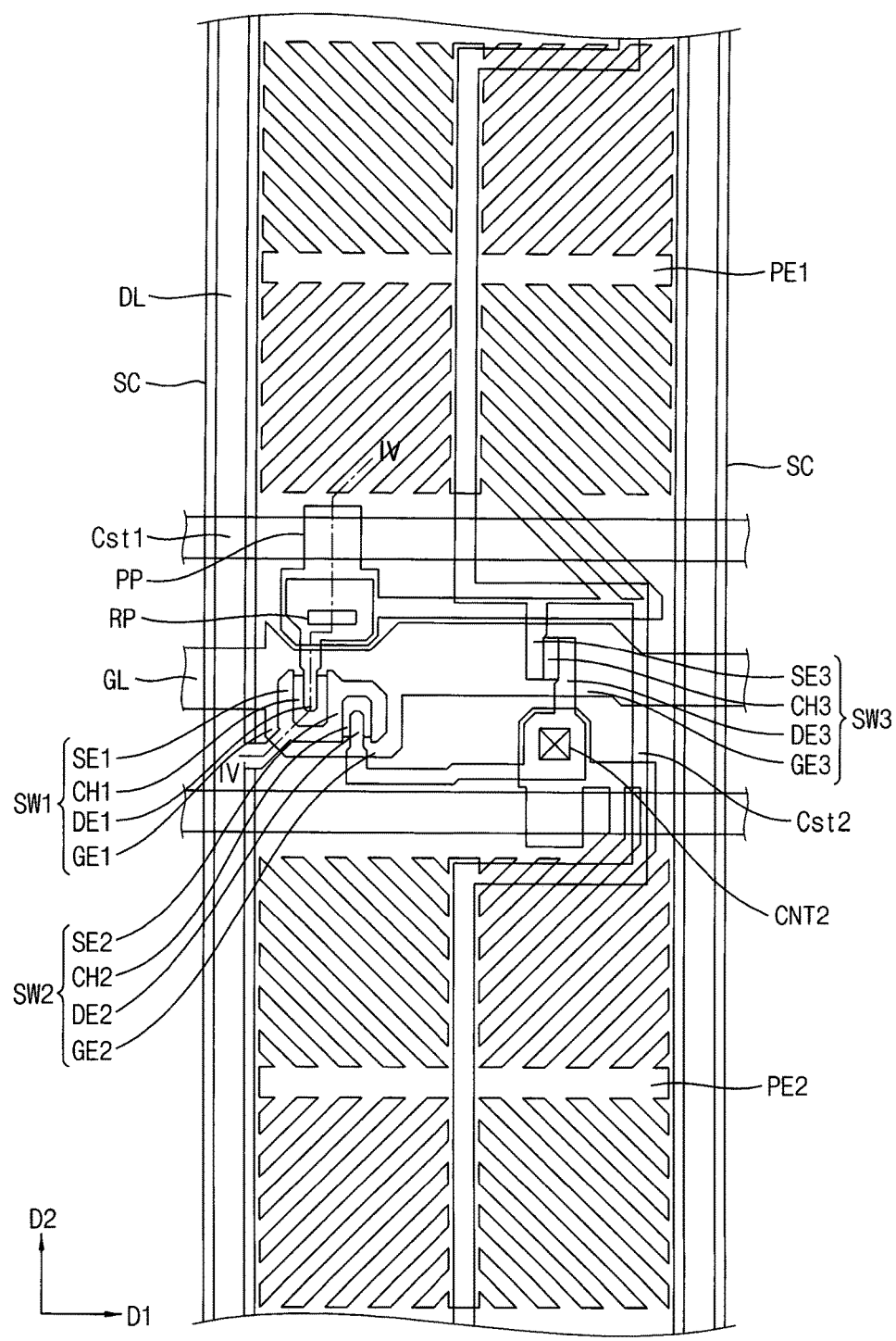
FIG. 41 is a plan view illustrating an exemplary embodiment of a display substrate repaired by a method of repairing a display substrate according to the invention.
Figure 42:
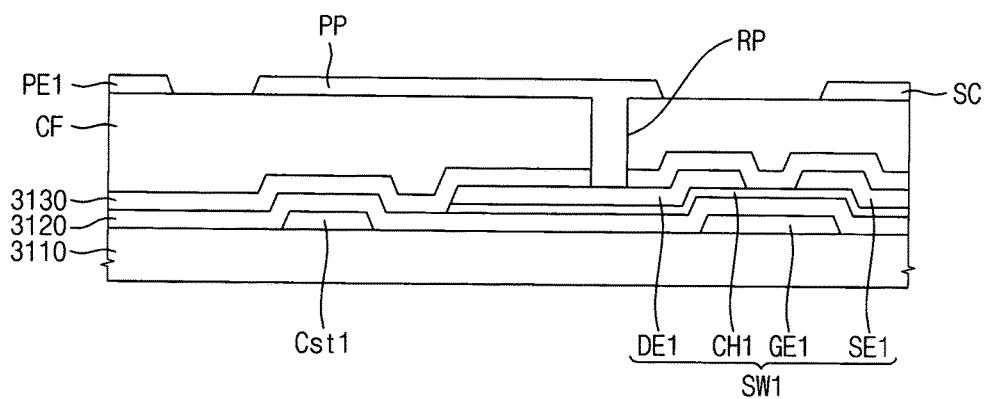
FIG. 42 is a cross-sectional view taken along line IV-IV' of FIG. 41.

FIG. 41 is a plan view illustrating a display substrate repaired by a method of repairing a display substrate according to an exemplary embodiment of the invention. FIG. 42 is a cross-sectional view taken along line IV-IV' of FIG. 41.

Referring to FIGS. 41 and 42, when a defect of the display substrate is a defect which is caused by non-forming of a contact hole connecting the first drain electrode DE1 and the high pixel electrode PE1, a display substrate repaired by a method of repairing a display substrate according to an exemplary embodiment of the invention is illustrated.

When a defect of the display substrate is a defect which is caused by non-forming of a contact hole connecting the first drain electrode DE1 and the high pixel electrode PE1, the first drain electrode DE1 and the high pixel electrode PE1 are enforcedly shorted for repairing the defect. In an exemplary embodiment, the process of enforcedly shorting the first drain electrode DE1 and the high pixel electrode PE1 may be performed using a laser beam, for example.

A laser beam is irradiated to an overlapping region of the first drain electrode DE1 and the high pixel electrode PE1, and thus a repair point RP is provided. The first drain electrode DE1 is electrically connected to the high pixel electrode PE1 by the repair point RP. Therefore, a display substrate having a defect which is caused by non-forming of a contact hole connecting the first drain electrode DE1 and the high pixel electrode PE1 may be repaired.

Figure 43:
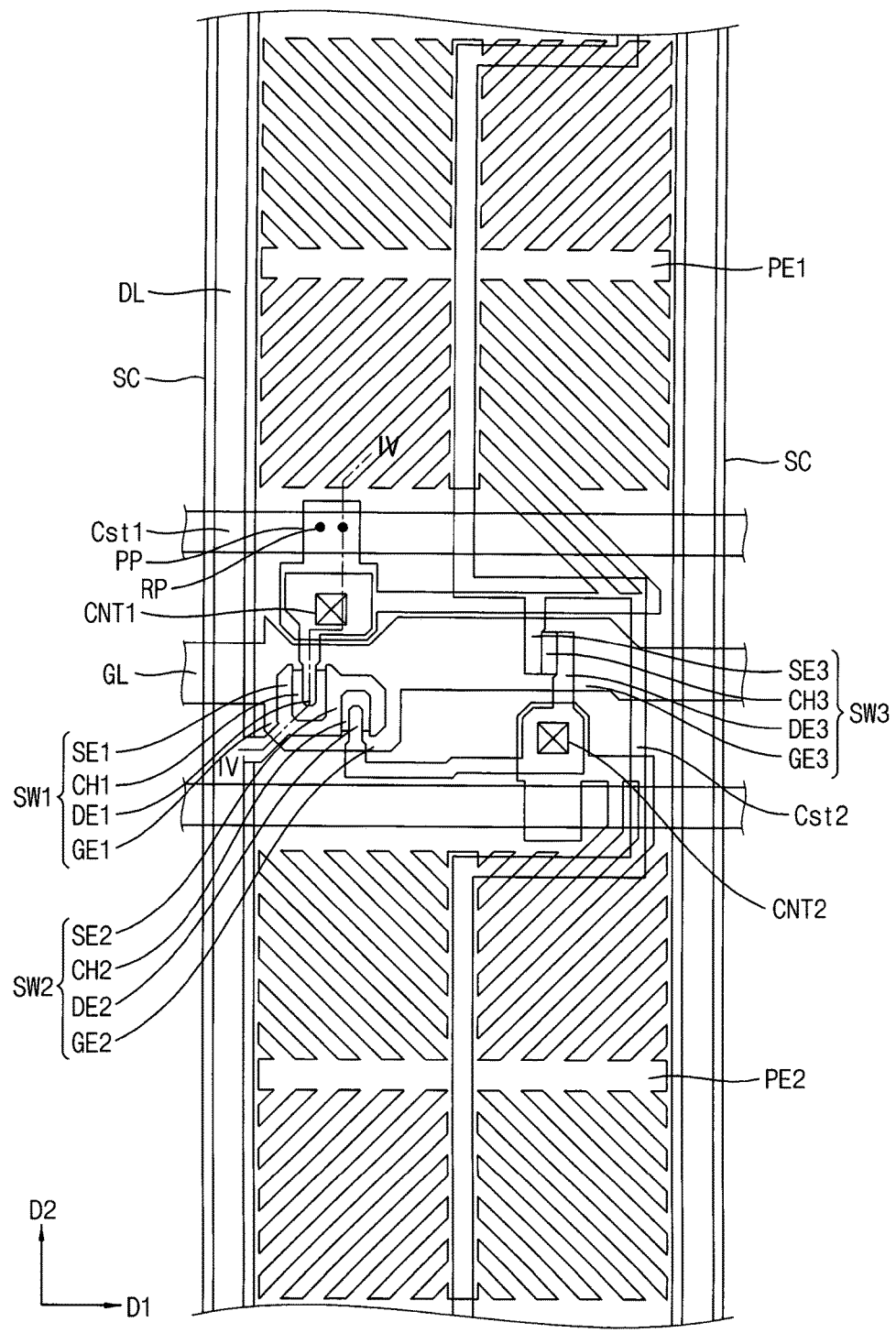
FIG. 43 is a plan view illustrating an exemplary embodiment of a display substrate repaired by a method of repairing a display substrate according to the invention.
Figure 44:
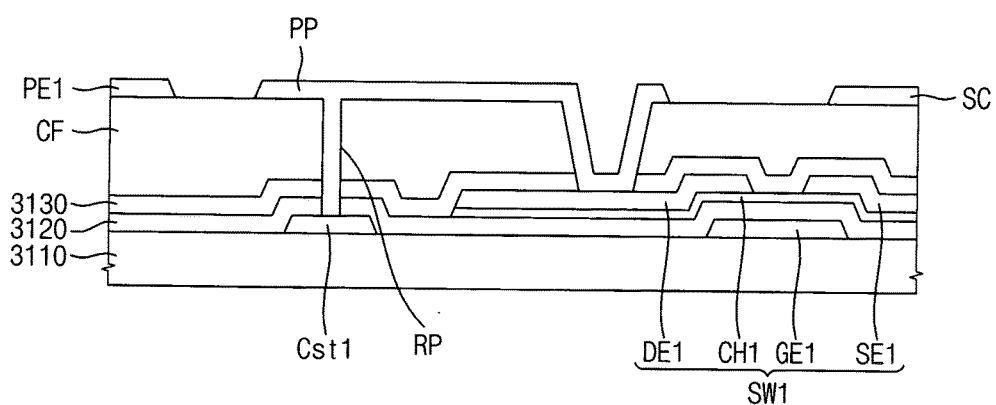
FIG. 44 is a cross-sectional view taken along line IV-IV' of FIG. 43.

FIG. 43 is a plan view illustrating a display substrate repaired by a method of repairing a display substrate according to an exemplary embodiment of the invention. FIG. 44 is a cross-sectional view taken along line IV-IV' of FIG. 43.

Referring to FIGS. 43 and 44, when a defect of the display substrate is a defect which needs darkening of a defective pixel to repair the defect, a display substrate repaired by a method of repairing a display substrate according to an exemplary embodiment of the invention is illustrated.

When a defect of the display substrate is a defect which needs darkening of a defective pixel to repair the defect, the repair electrode PP and the first storage line Cst1 are enforcedly shorted for repairing the defective pixel. In an exemplary embodiment, the process of enforcedly shorting the repair electrode PP and the first storage line Cst1 may be performed using a laser beam, for example.

A laser beam is irradiated to an overlapping region of the repair electrode PP and the first storage line Cst1, and thus a repair point RP is provided. The repair electrode PP is electrically connected to the first storage line Cst1 by the repair point RP. In addition, the first drain electrode DE1 is electrically connected to the repair electrode PP. Therefore, the first drain electrode DE1 and the first storage line Cst1 are shorted, and thus the high pixel electrode PE1 may be darkened.

According to the exemplary embodiment, when a defect of the display substrate is a defect which needs darkening of a defective pixel to repair the defect, the repair electrode and the first storage line are enforcedly shorted for repairing the defective pixel. In addition, when a defect of the display substrate is a defect which is caused by non-forming of a contact hole connecting the drain electrode and the pixel electrode, the drain electrode and the pixel electrode are enforcedly shorted for repairing the defect. That is, a selective repairing a display substrate according to a defect of the display substrate may be performed.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
a gate metal pattern comprising a gate line extending in a first direction, a gate electrode electrically connected to the gate line and a storage line;
a data metal pattern comprising a data line extending in a second direction crossing the first direction, a source electrode electrically connected to the data line and a drain electrode spaced apart from the source electrode;
a repair electrode extending in the second direction and overlapping the storage line;
an organic layer disposed on the data metal pattern; and
a pixel electrode disposed on the organic layer and electrically connected to the drain electrode through a contact hole formed through the organic layer,
wherein the repair electrode is disposed on the same layer as the data metal pattern and directly electrically connected and directly physically connected to a contact pad of the drain electrode, the contact pad is overlapped with the contact hole and the contact hole is spaced apart from the repair electrode in a plane view.

2. The display substrate of claim 1, wherein the storage line comprises:
a protrusion portion protruding along the second direction and overlapping the repair electrode.

3. A display substrate comprising:
a gate metal pattern comprising a gate line extending in a first direction, a gate electrode electrically connected to the gate line and a storage line;
a data metal pattern comprising a data line extending in a second direction crossing the first direction, a source electrode electrically connected to the data line and a drain electrode spaced apart from the source electrode;
a repair electrode extending in the second direction and overlapping the storage line;
an organic layer disposed on the data metal pattern; and
a pixel electrode disposed on the organic layer and electrically connected to the drain electrode through a contact hole formed through the organic layer,
wherein the repair electrode is disposed on the same layer as the pixel electrode and electrically connected to the pixel electrode.

4. The display substrate of claim 3, wherein the storage line comprises:
a protrusion portion protruding along the second direction and overlapping the repair electrode.

5. The display substrate of claim 1, wherein the storage line is parallel with the gate line.

6. The display substrate of claim 1, wherein the repair electrode is electrically connected to the storage line by a repair point which is formed where the storage line and the repair electrode is overlapped with each other, and the repair point is spaced apart from the contact hole in the plane view.

* * * * *